US011236420B2

(12) United States Patent
Mitsumori et al.

(10) Patent No.: US 11,236,420 B2
(45) Date of Patent: Feb. 1, 2022

(54) CLEANING METHOD

(71) Applicant: TOKYO ELECTRON LIMITED, Tokyo (JP)

(72) Inventors: Akiyoshi Mitsumori, Miyagi (JP); Shin Yamaguchi, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/372,450

(22) Filed: Apr. 2, 2019

(65) Prior Publication Data

US 2019/0304761 A1 Oct. 3, 2019

(30) Foreign Application Priority Data

Apr. 3, 2018 (JP) .............................. JP2018-071852

(51) Int. Cl.
*C23C 16/44* (2006.01)
*H01J 37/32* (2006.01)
(Continued)

(52) U.S. Cl.
CPC .......... *C23C 16/4405* (2013.01); *F25B 41/31* (2021.01); *H01J 37/32522* (2013.01);
(Continued)

(58) Field of Classification Search
CPC ........ H01J 37/32862; H01J 2237/2001; H01L 21/6831; H01L 21/6833; H01L 21/67098;
(Continued)

(56) References Cited

U.S. PATENT DOCUMENTS 6,091,060 A * 7/2000 Getchel ............ H01L 21/67248
118/725
7,178,353 B2 * 2/2007 Cowans ................. F25B 41/20
62/196.4
(Continued)

FOREIGN PATENT DOCUMENTS

JP H05133622 * 5/1993
JP 2002134664 A * 5/2002
(Continued)

OTHER PUBLICATIONS

Hong Xiao, Plasma-Enhanced Chemical Vapor Deposition Tetraethoxysilane Process, Introduction to Semiconductor Manufacturing Technology (2nd Edition) (SPIE 2012). (Year: 2012).*
(Continued)

*Primary Examiner* — Mikhail Kornakov
*Assistant Examiner* — Richard Z. Zhang
(74) *Attorney, Agent, or Firm* — Studebaker & Brackett PC

(57) ABSTRACT

The step of removing the reaction product includes a step of loading a dummy wafer on the loading table, a step of increasing the temperature of the loading table, and a step of removing the reaction product after increasing the temperature of the loading table. In the step of increasing the temperature of the loading table, the temperature of the loading table is increased by opening an expansion valve between an output terminal of a condenser and an input terminal of the heat exchange unit, inputting heat to the loading table, opening a flow dividing valve between an output terminal of a compressor and the input terminal of the heat exchange unit, and adjusting an opening degree of the flow dividing valve.

7 Claims, 19 Drawing Sheets

(51) Int. Cl.
  *H01L 21/683* (2006.01)
  *F25B 41/31* (2021.01)
(52) U.S. Cl.
  CPC .... *H01J 37/32862* (2013.01); *H01L 21/6831* (2013.01); *F25B 2400/0411* (2013.01); *F25B 2600/2513* (2013.01); *H01J 2237/2001* (2013.01)
(58) Field of Classification Search
  CPC ......... H01L 21/67103; H01L 21/67109; H01L 21/02274; H01L 21/0262; H01L 21/28556; H01L 21/76876; H01L 21/28194; H01L 21/00–86; C23C 16/4404; C23C 16/4405; F25B 2400/0411; F25B 2600/2513; F25B 2600/2515; F25B 1/00–49/046
  See application file for complete search history.

(56) References Cited

U.S. PATENT DOCUMENTS

| | | | |
|---|---|---|---|
| 7,415,835 B2* | 8/2008 | Cowans | F25B 41/20 62/190 |
| 8,453,468 B1* | 6/2013 | Cowans | F25D 19/006 62/65 |
| 2001/0037652 A1* | 11/2001 | Sasayama | F25D 17/02 62/201 |
| 2005/0221020 A1* | 10/2005 | Fukiage | C23C 16/4404 427/569 |
| 2005/0279384 A1* | 12/2005 | Guidotti | C23C 16/4405 134/18 |
| 2006/0266060 A1* | 11/2006 | Choi | F25B 41/20 62/196.1 |
| 2007/0091537 A1* | 4/2007 | Buchberger, Jr. | H01L 21/67248 361/234 |
| 2008/0006044 A1* | 1/2008 | Tan | F25B 49/02 62/197 |
| 2009/0126378 A1* | 5/2009 | Oh | F25B 25/005 62/115 |
| 2010/0126666 A1* | 5/2010 | Tandou | H01L 21/67248 156/345.27 |
| 2010/0171044 A1* | 7/2010 | Lee | H01L 21/67109 250/491.1 |

FOREIGN PATENT DOCUMENTS

| | | | |
|---|---|---|---|
| JP | 2004-158563 A | | 6/2004 |
| JP | 2007-116099 A | | 5/2007 |
| JP | 2008-501927 A | | 1/2008 |
| JP | 2010159945 A | * | 7/2010 |
| JP | 2011-501092 A | | 1/2011 |
| JP | 2012-064970 A | | 3/2012 |
| JP | 2016084972 A | * | 5/2016 |
| KR | 20110112533 A | * | 10/2011 |
| KR | 20170011534 A | * | 2/2017 |
| WO | 2005/121657 A2 | | 12/2005 |
| WO | 2009/049096 A1 | | 4/2009 |

OTHER PUBLICATIONS

Hong Xiao, Plasma-Enhanced Chemical Vapor Deposition Tetraethoxysilane Process, Introduction to Semiconductor Manufacturing Technology (2nd Ed. SPIE 2012). (Year: 2012).*

* cited by examiner

|  | FCV-1 | ... | FCV-n | TOTAL |
|---|---|---|---|---|
| T1 | 30% | ... | 10% | 100% |
| T2 | 20% | ... | 5% | 100% |
| ... | ... | ... | ... | 100% |

PT2:

|  | FCV-1 | ... | FCV-n | TOTAL |
|---|---|---|---|---|
| T1 | 50% | ... | 20% | 100% |
| ... | 50% | ... | 20% | 100% |

PT3:

|  | FCV-1 | ... | FCV-n | TOTAL |
|---|---|---|---|---|
| T1 | 100% | ... | 0% | 100% |
| T2 | 0% | ... | 100% | 100% |
| ... | ... | ... | ... | 100% |

CLEANING METHOD

CROSS-REFERENCE TO RELATED APPLICATIONS

This application is based on and claims the benefit of priority from Japanese Patent Application No. 2018-071852 filed on Apr. 3, 2018 with the Japan Patent Office, the entire contents of which are incorporated herein by reference.

TECHNICAL FIELD

Exemplary embodiments of the present disclosure relates to a cleaning method.

BACKGROUND

It is necessary to adjust a temperature in a case where treatments such as deposition and etching are performed on a workpiece such as a wafer by a plasma process or the like in a semiconductor manufacturing apparatus. For example, a heat control method and its system are disclosed in Japanese Translation of PCT International Application Publication No. 2008-501927 and Japanese Translation of PCT International Application Publication No. 2011-501092.

SUMMARY

In one aspect, there is provided a cleaning method for a component of a plasma processing apparatus. The cleaning method includes a step of removing a reaction product formed on a loading table which is disposed in the plasma processing apparatus and on which a workpiece is loaded. The loading table includes a heat exchange unit that is disposed in the plasma processing apparatus and exchanges heat using a refrigerant. The step of removing the reaction product includes a step of loading a dummy wafer on the loading table, a step of increasing a temperature of the loading table, and a step of removing the reaction product after increasing the temperature of the loading table. In the step of increasing the temperature of the loading table, the temperature of the loading table is increased by opening an expansion valve between an output terminal of a condenser and an input terminal of the heat exchange unit, the condenser condensing the refrigerant discharged from the heat exchange unit and compressed and supplying the refrigerant to the heat exchange unit, inputting heat to the loading table, opening a flow dividing valve between an output terminal of a compressor and the input terminal of the heat exchange unit, the compressor compressing the refrigerant discharged from the heat exchange unit and supplying the refrigerant to the condenser, and adjusting an opening degree of the flow dividing valve.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

BRIEF DESCRIPTION OF THE DRAWINGS

FIG. 14 is a diagram for illustratively describing an operation of the temperature adjustment system illustrated in FIG. 11.

DETAILED DESCRIPTION

Figure 1:
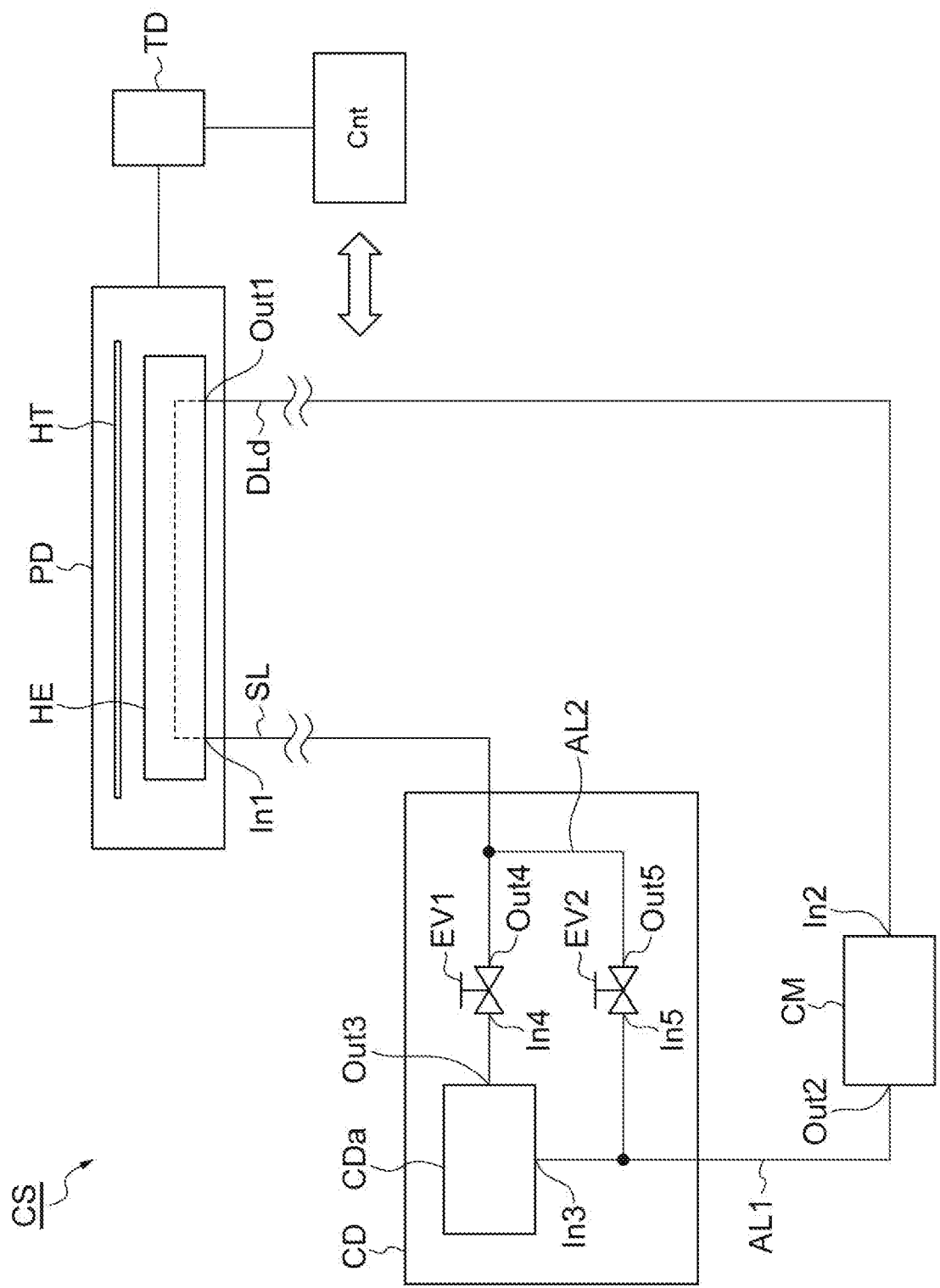
FIG. 1 is a diagram illustrating one example of a configuration of a temperature adjustment system according to one exemplary embodiment of the present disclosure.

In the following detailed description, reference is made to the accompanying drawings, which form a part hereof. The exemplary embodiments described in the detailed description, drawing, and claims are not meant to be limiting. Other exemplary embodiments may be utilized, and other changes may be made, without departing from the spirit or scope of the subject matter presented here.

The present disclosure provides a technology for suitably cleaning a loading table on which a workpiece is loaded.

Description of Exemplary Embodiment of Present Disclosure

First, an exemplary embodiment of the present disclosure will be illustratively described. A cleaning method according to one aspect of the present disclosure is a cleaning method for a component of a plasma processing apparatus. The cleaning method includes a step of removing a reaction product formed on a loading table that is disposed in the plasma processing apparatus and is where a workpiece is loaded. The loading table includes a heat exchange unit that is disposed in the plasma processing apparatus and exchanges heat using a refrigerant. The step of removing the reaction product includes a step of loading a dummy wafer on the loading table, a step of increasing the temperature of the loading table, and a step of removing the reaction product after increasing the temperature of the loading table. In the step of increasing a temperature of the loading table, the temperature of the loading table is increased by opening an expansion valve between an output terminal of a condenser that condenses the compressed refrigerant discharged from the heat exchange unit and supplies the refrigerant to the heat exchange unit and an input terminal of the heat exchange unit, inputting heat to the loading table, opening a flow dividing valve between an output terminal of a compressor that compresses the refrigerant discharged from the heat exchange unit and supplies the refrigerant to the condenser and the input terminal of the heat exchange unit, and adjusting an opening degree of the flow dividing valve. Since the reaction product can be removed by increasing the temperature of the loading table, the reaction product can be favorably removed at a relatively high temperature.

In one exemplary embodiment of the present disclosure, the reaction product has carbon, fluorine, and silicon.

In one exemplary embodiment of the present disclosure, in the step of removing the reaction product, the reaction product is removed using a gas mixture of gas including fluorine and gas including oxygen.

In one exemplary embodiment of the present disclosure, the gas including fluorine includes at least one of $CF_4$, $NF_3$, and $C_4F_8$, and the gas including oxygen includes at least one of $O_2$, $O_3$, CO, $CO_2$, and COS.

In one exemplary embodiment of the present disclosure, a step of finishing inputting heat to the loading table in response to a finish of the step of removing the reaction product is further included.

In one exemplary embodiment of the present disclosure, inputting heat to the loading table is performed using plasma.

In one exemplary embodiment of the present disclosure, the loading table includes a heater, and inputting heat to the loading table is performed by the heater.

As described thus far, a technology for suitably cleaning a loading table on which a workpiece is loaded is provided.

Details of Exemplary Embodiment of Present Disclosure

Hereinafter, various exemplary embodiments will be described in detail with reference to the drawings. The same or corresponding parts in each drawing are designated by the same reference signs.

As illustrated in FIG. 1, a temperature adjustment system CS includes a loading table PD, a measurement device TD, a control unit Cnt, a supply line SL, a discharge line DLd, a vapor line AL1, a vapor line AL2, a condensing device CD, and a compressor CM. The loading table PD includes a heat exchange unit HE and a heater HT. The condensing device CD includes a condenser CDa, an expansion valve EV1 (expansion valve), and a flow dividing valve EV2 (flow dividing valve). For example, the temperature adjustment system CS may be used in a plasma processing apparatus 10 illustrated in FIG. 6. The condensing device CD and the compressor CM may be included in a chiller unit of the plasma processing apparatus 10 illustrated in FIG. 6.

The temperature adjustment system CS illustrated in FIG. 1 corresponds to a temperature adjustment system illustrated in each of FIG. 7, FIG. 11, FIG. 15, FIG. 16, and FIG. 18. The condensing device CD illustrated in FIG. 1 corresponds to the condensing device CD illustrated in each of FIG. 7, FIG. 11, FIG. 15, and FIG. 16 and each of a condensing device CD-1 to a condensing device CD-n illustrated in FIG. 18. The compressor CM illustrated in FIG. 1 corresponds to the compressor CM illustrated in FIG. 7, each of a compressor CMd-1 to a compressor CMd-n illustrated in FIG. 11, each of a compressor CMd and a compressor CMu illustrated in FIG. 15, each of the compressor CMd-1 to the compressor CMd-n and the compressor CMu illustrated in FIG. 16 and each of the compressor CMd-1 to the compressor CMd-n illustrated in FIG. 18.

The discharge line DLd is disposed between an output terminal Out1 of the heat exchange unit HE and an input terminal In2 of the compressor CM. The discharge line DLd sends a refrigerant discharged from the heat exchange unit HE to the compressor CM.

The supply line SL is disposed between an input terminal In1 of the heat exchange unit HE and an output terminal Out3 of a condenser CDa. The expansion valve EV1 is disposed in the supply line SL. The supply line SL sends a refrigerant condensed by the condenser CDa to the heat exchange unit HE through the expansion valve EV1. The refrigerant output from the expansion valve EV1 is in a liquid state, and the dryness fraction of the refrigerant output from the expansion valve EV1 is approximately equal to 0 [%].

The vapor line AL1 is disposed between an output terminal Out2 of the compressor CM and an input terminal In3 of the condenser CDa. The vapor line AL2 is disposed between the output terminal Out2 of the compressor CM and an output terminal Out4 of the expansion valve EV1. In other words, the vapor line AL2 is disposed between an area of the supply line SL between the expansion valve EV1 and the heat exchange unit HE, and the vapor line AL1. The flow dividing valve EV2 is disposed in the vapor line AL2.

The vapor line AL2 divides a compressed refrigerant that is sent to the vapor line AL1 from the compressor CM. The flow dividing valve EV2 adjusts the flow rate of the refrigerant that is directly supplied to the heat exchange unit HE from the compressor CM through the vapor line AL2. The refrigerant output from the flow dividing valve EV2 is in a vapor state, and the dryness fraction of the refrigerant output from the flow dividing valve EV2 is approximately equal to 100 [%].

An input terminal In4 of the expansion valve EV1 is connected to the output terminal Out3 of the condenser CDa through the supply line SL. The output terminal Out4 of the expansion valve EV1 is connected to the input terminal In1 of the heat exchange unit HE through the supply line SL. An input terminal In5 of the flow dividing valve EV2 is connected to the vapor line AU through the vapor line AL2. An output terminal Out5 of the flow dividing valve EV2 is connected to the area of the supply line SL between the expansion valve EV1 and the heat exchange unit HE through the vapor line AL2.

The temperature adjustment system CS adjusts the temperature of the loading table PD. For example, the temperature of the loading table PD may be the temperature of the surface (a loading surface on which a wafer W is loaded) of the loading table PD. The loading table PD is disposed inside a processing container 12 of the plasma processing apparatus 10. The wafer W (workpiece) is loaded on the loading table PD. The heat exchange unit HE is disposed inside the loading table PD and exchanges heat using the refrigerant.

The compressor CM compresses the refrigerant discharged from the heat exchange unit HE. The condenser CDa condenses the refrigerant compressed by the compressor CM.

The measurement device TD measures the temperature of the loading table PD and transmits a measurement result to the control unit Cnt. The measurement device TD measures the temperature of the loading table PD using a temperature measurer, not illustrated. The temperature measurer is a thermistor or the like and is disposed inside the loading table PD.

The control unit Cnt includes a CPU, a ROM, a RAM, and the like. The control unit Cnt causes the CPU to execute a computer program recorded in a recording device such as the ROM or the RAM. The computer program includes a program for causing the CPU to execute a function of controlling a general operation of the plasma processing apparatus 10. The computer program particularly includes a program for causing the CPU of the control unit Cnt to execute a temperature adjustment process of adjusting the temperature of the loading table PD using the temperature adjustment system CS.

The control unit Cnt adjusts heat input to the loading table PD and the opening degree of each of the expansion valve EV1 and the flow dividing valve EV2 based on the temperature of the loading table PD measured by the measurement device TD. More specifically, in the case of increasing the temperature of the loading table PD in a situation where the expansion valve EV1 is open, the flow dividing valve EV2 is closed, and the opening degree of the expansion valve EV1 is adjusted such that the loading table PD has a first temperature, the control unit Cnt inputs heat to the loading table PD, further opens the flow dividing valve EV2, and adjusts the opening degree of the flow dividing valve EV2 such that the temperature of the loading table PD reaches a second temperature (D [° C.]) higher than a first temperature (C [° C.]) (C [° C.]<D [° C.]). The heat input to the loading table PD may be performed using plasma. In addition, the heat input to the loading table PD may be performed by the heater HT.

The control unit Cnt performs a step of removing a reaction product in a case where the temperature of the loading table PD reaches the second temperature. During the removing step, the temperature of the loading table PD is maintained at the second temperature or higher. After the removing step is finished, the heat input to the loading table PD is finished, and the flow dividing valve EV2 is closed. The control unit Cnt adjusts a period of time for the temperature of the loading table PD to reach the second temperature by adjusting the opening degree of the flow dividing valve EV2.

Figure 2:
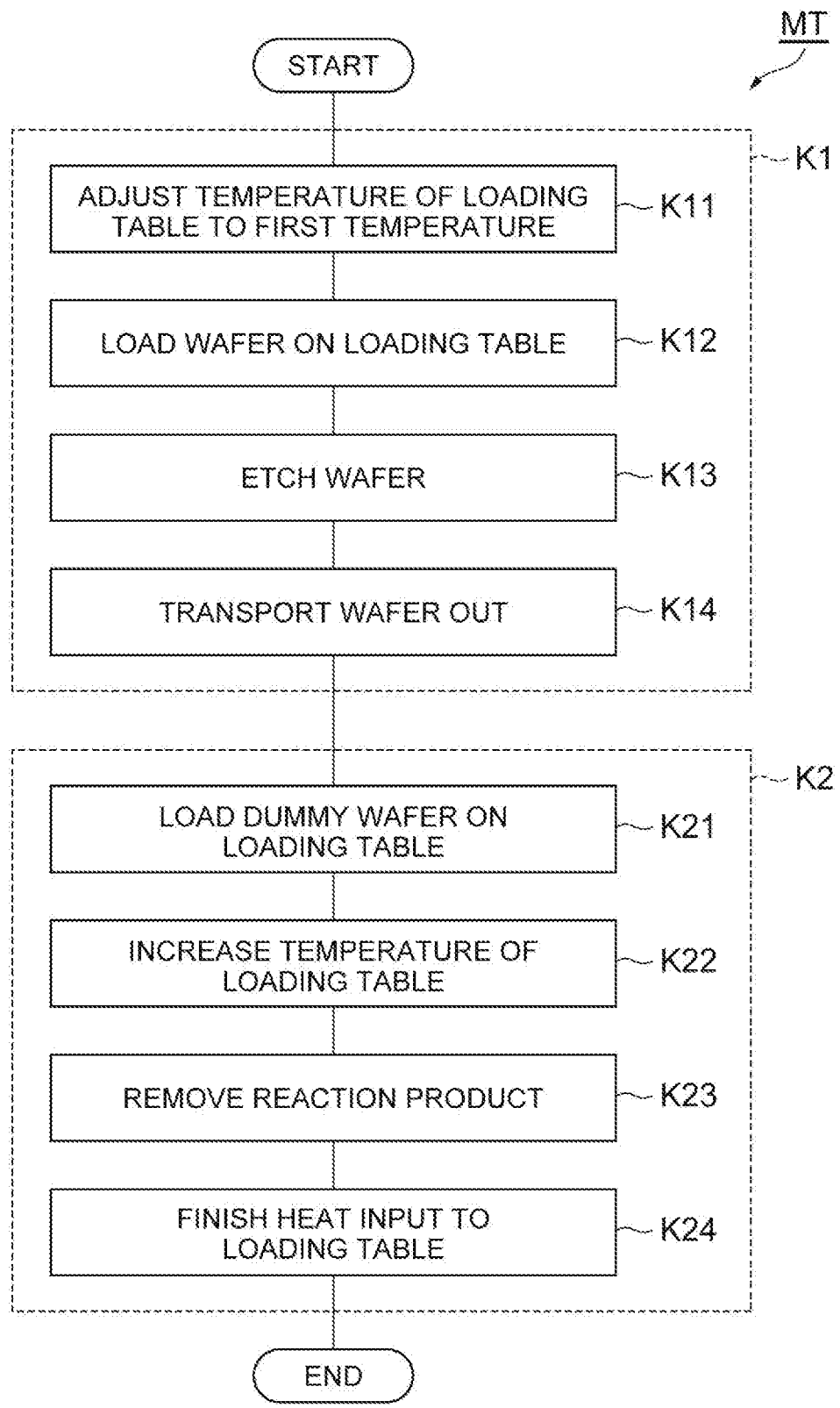
FIG. 2 is a flowchart illustrating the contents of a process including a cleaning method according to one exemplary embodiment of the present disclosure.

FIG. 2 illustrates a flowchart related to a processing method MT. The processing method MT includes step K1 and step K2. Step K2 is executed after step K1. Step K2 is the cleaning method according to one exemplary embodiment of the present disclosure. Step K1 includes step K11, step K12, step K13, and step K14. Step K2 includes step K21, step K22, step K23, and step K24. For example, the processing method MT is performed by the plasma processing apparatus 10 illustrated in FIG. 6.

In step K11, the temperature of the loading table PD disposed inside the processing container 12 of the plasma processing apparatus 10 is adjusted to the first temperature. The adjustment of the temperature of the loading table PD may be performed using a chiller unit (a chiller unit CH or the like) and can also be performed using the temperature adjustment system CS illustrated in FIG. 1.

In step K12 after step K11, the wafer W is loaded on the loading table PD. In step K13 after step K12, a process (for example, an etching process) is performed on the water W. In step K14 after step K13, the processed wafer W is transported outside the processing container 12.

Figure 3:
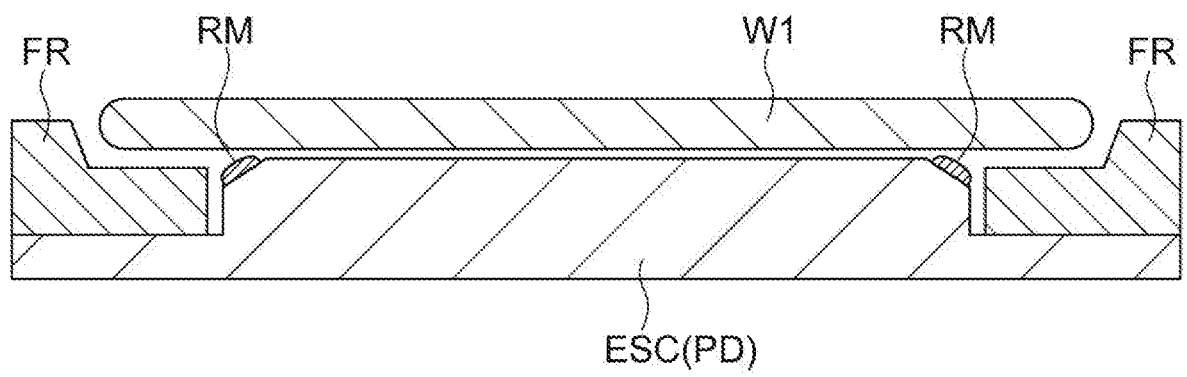
FIG. 3 is a diagram illustrating a reaction product that may be footed on a loading table.

By performing step K12, a reaction product RM based on the process of step K12 is formed in a peripheral part of an electrostatic chuck ESC of the loading table PD as illustrated in FIG. 3. The reaction product RM clings to the electrostatic chuck ESC by van der Waals force. Van der Waals force is attraction that acts between molecules or between atoms. The van der Waals force may be reduced by increasing the temperature of the electrostatic chuck ESC. For example, the reaction product RM may have carbon, fluorine, and silicon.

Step K2 after step K1 corresponds to the cleaning method for a component (hereinafter, referred to as, for example, the loading table PD) of the plasma processing apparatus 10. More specifically, step K2 is a step of removing the reaction product RM formed on the loading table PD. Step K2 may be performed in accordance with a below-described timing chart illustrated in FIG. 4 using the temperature adjustment system CS.

In step K21, a dummy wafer W1 is loaded on the loading table PD. The dummy wafer W1 is a wafer that is used for cleaning the loading table PD.

In step K22 after step K21, the temperature of the loading table PD is increased. That is, in step K22, the expansion valve EV1 is opened, and heat is input to the loading table PD. The flow dividing valve EV2 is opened, and the temperature of the flow dividing valve EV2 is adjusted. By doing so, the temperature of the loading table PD is increased in step K22.

Figure 4:
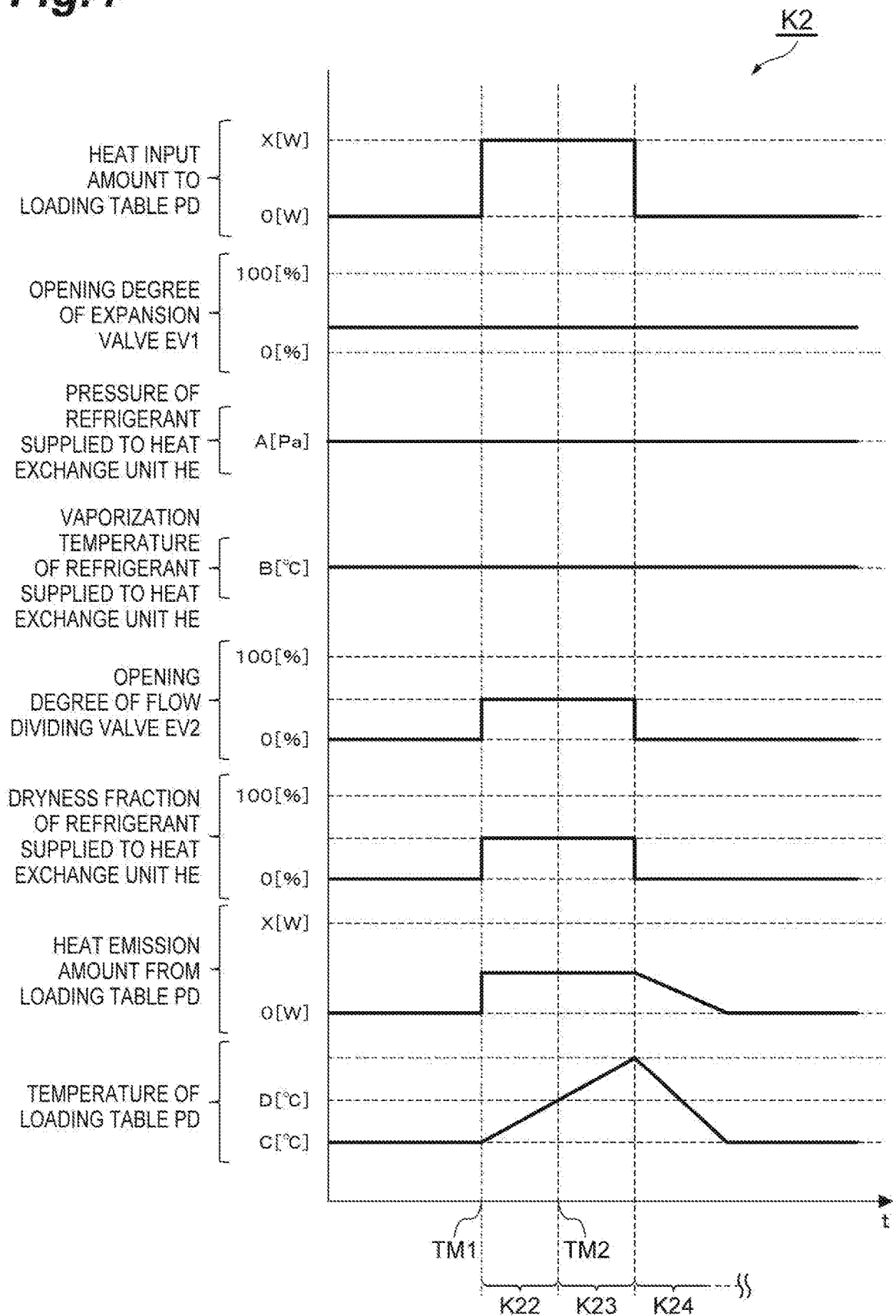
FIG. 4 is a timing chart illustrating one example of an operation of the temperature adjustment system illustrated in FIG. 1.

Timing TM1 illustrated in FIG. 4 corresponds to a timing at which step K22 is started. Timing TM2 illustrated in FIG. 4 corresponds to a timing at which step K23 is started after step K22. During the period in which step K23 is executed, the temperature of the loading table PD is maintained at D [° C.] or higher.

In step K23 after step K22, the reaction product RM is removed after the temperature of the loading table PD is increased. In step K23, for example, the temperature of the loading table PD may be approximately equal to 20 [° C.] (D=20 [° C.]) or higher. In step K24, the heat input to the loading table PD is finished in response to the finish of step K23.

In step K23, the reaction product RM may be removed using a gas mixture of gas including fluorine and gas including oxygen. In the gas mixture, the gas including fluorine may include at least one of $CF_4$, $NF_3$, and $C_4F_8$. In the gas mixture, the gas including oxygen may include at least one of $O_2$, $O_3$, CO, $CO_2$, and COS. In step K23, plasma of the gas mixture is generated using relatively high power having a high frequency, and the reaction product RM is removed.

The operation of the temperature adjustment system CS will be described with reference to FIG. 4 and FIG. 5. The operation (temperature adjustment method) of the temperature adjustment system CS illustrated in the timing chart of FIG. 4 is implemented by control of the control unit Cnt and is executed in step K2. The temperature adjustment method is a temperature adjustment method of adjusting the temperature of the loading table PD on which the wafer W is loaded using a refrigerant.

First, in step K21, the temperature of the loading table PD is adjusted to C [° C.] by opening the expansion valve EV1, closing the flow dividing valve EV2, and adjusting the opening degree of the expansion valve EV1. In this case, there is no heat input to the loading table PD, and the heat input to the loading table PD is equal to 0 [W].

The opening degree of the expansion valve EV1 is maintained at a constant opening degree during the execution of the temperature adjustment method. The pressure of the refrigerant supplied to the heat exchange unit HE is maintained at A [Pa] during the execution of the temperature adjustment method. The vaporization temperature (control temperature) of the refrigerant supplied to the heat exchange unit HE is maintained at B [° C.] during the execution of the temperature adjustment method.

In step K22, the temperature of the loading table PD is increased from C [° C.] to D [° C.] (C [° C.]<D [° C.]). At timing TM1 at which step K22 is started, a heat amount of X [W] is input to the loading table PD. Furthermore, the opening degree of the flow dividing valve EV2 is adjusted to a value less than 100 [%] by further opening the flow dividing valve EV2.

Thus, the dryness fraction of the refrigerant supplied to the heat exchange unit HE becomes equal to a value less than 100 [%]. Accordingly, a heat emission amount from the loading table PD may become less than the heat input amount X [W]. Accordingly, the temperature of the loading table PD is increased and may become equal to D [° C.] at timing TM2 at the end of step K22 (at the start of step K23).

In a case where timing TM2 at which the temperature of the loading table PD becomes equal to D [° C.] is reached, step K23 is executed. During the execution of step K23, the temperature of the loading table PD is maintained at D [° C.] or higher.

In a case where step K23 is finished, a transition is made to step K24. The heat input to the loading table PD is finished, and the flow dividing valve EV2 is closed. Accordingly, the dryness fraction of the refrigerant supplied to the heat exchange unit HE becomes approximately equal to 0 [%]. The heat emission amount from the loading table PD becomes equal to 0 [W]. The temperature of the loading table PD becomes equal to C [° C.].

According to step K2 of cleaning the loading table PD, the reaction product RM can be removed by increasing the temperature of the loading table PD. Thus, the reaction product RM can be favorably removed at a relatively high temperature.

The period of time for the temperature of the loading table PD to reach D [° C.] may be adjusted by adjusting the opening degree of the flow dividing valve EV2. For example, as illustrated in FIG. 4, in the case of causing the temperature of the loading table PD to reach D [° C.] at timing TM2 at which the heat input to the loading table PD is finished and the flow dividing valve EV2 is closed, the opening degree of the flow dividing valve EV2 is reduced as the period of time between timing TM1 and timing TM2 is increased (as timing TM2 is retarded).

Figure 5:
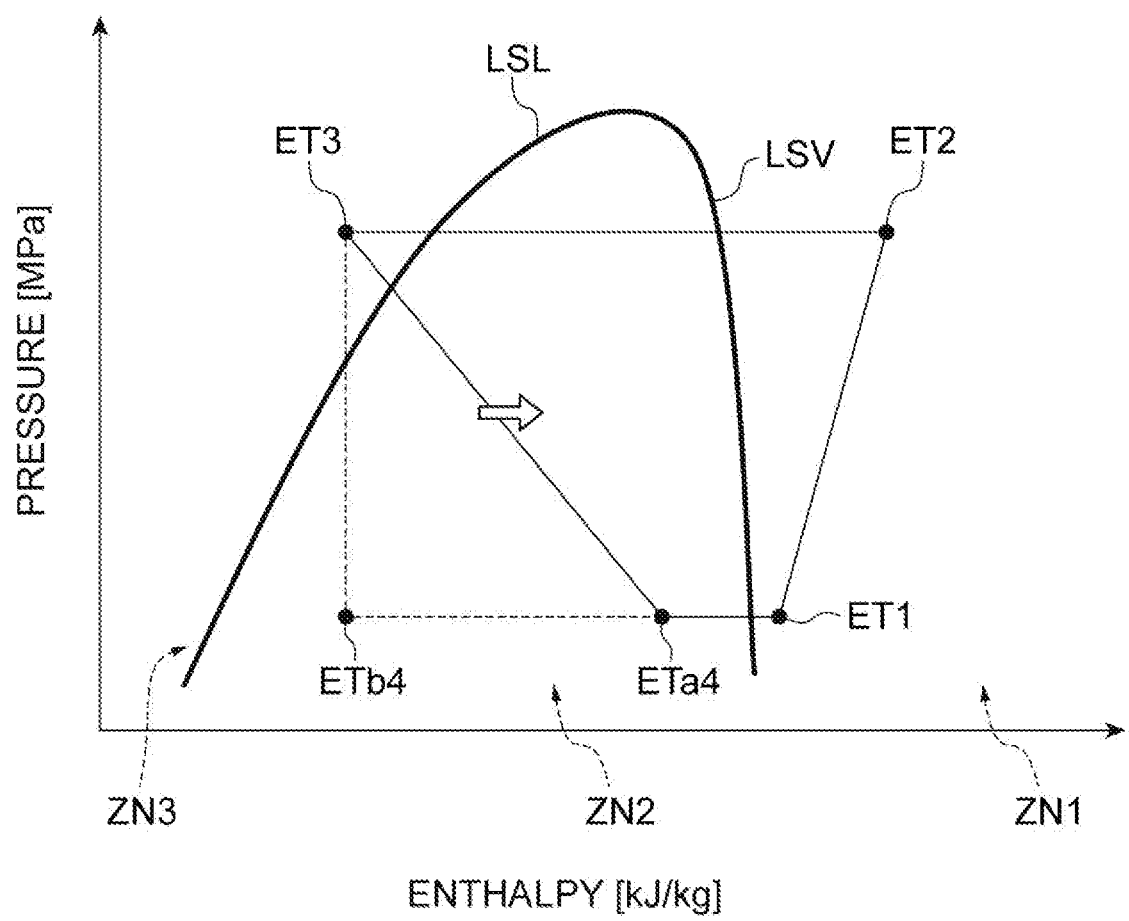
FIG. 5 is a diagram illustrating a Ph diagram (Mollier diagram) representing one example of a refrigeration cycle of the temperature adjustment system according to one exemplary embodiment of the present disclosure.

FIG. 5 is a diagram illustrating a Ph diagram at the time of increasing the temperature of the loading table PD (a period from timing TM1 until timing TM2). In FIG. 5, a saturated liquid line LSL and a saturated vapor line LSV are shown. In FIG. 5, a superheated vapor area ZN1, a wet vapor area ZN2, and a supercooling area ZN3 are shown.

First, the refrigerant is supplied to the compressor CM from the heat exchange unit HE (state ET1). Then, the refrigerant is compressed by the compressor CM. The compressed refrigerant is divided into the condenser CDa and the flow dividing valve EV2 from the compressor CM.

The refrigerant (state ET2) divided to the condenser CDa is condensed by the condenser CDa. The condensed refrigerant supplied to the expansion valve EV1 is a refrigerant having a dryness fraction approximately equal to 0 [%] (state ET3).

The flow dividing valve EV2 adjusts the flow rate of the refrigerant (refrigerant having a dryness fraction approximately equal to 100 [%]) output to the heat exchange unit HE from the compressor CM. A refrigerant (refrigerant having a dryness fraction greater than 0 [%] and less than 100 [%]) into which the refrigerant (refrigerant having a dryness fraction approximately equal to 0 [%]) output from the expansion valve EV1 and the refrigerant (refrigerant having a dryness fraction approximately equal to 100 [%]) output from the flow dividing valve EV2 are mixed is supplied to the heat exchange unit HE through the supply line SL (state ETa4).

In a case where the flow dividing valve EV2 is closed, the refrigerant supplied to the heat exchange unit HE is only the refrigerant that is output from the expansion valve EV1 and has a dryness fraction approximately equal to 0 [%], and the refrigerant is set to be in a state ETb4 at a furthest position (enthalpy value) from the state ET1. As the opening degree of the flow dividing valve EV2 is increased, the flow rate of the refrigerant that is supplied to the heat exchange unit HE from the compressor CM through the vapor line AL2 and has a dryness fraction approximately equal to 100 [%] is increased. As the opening degree of the flow dividing valve EV2 is increased, the position (enthalpy value) of the state ETa4 moves in the direction of an arrow in FIG. 5 from the position of the state ETb4 and approaches the position of the state ET1.

The case of using the refrigerant (refrigerant having a dryness fraction greater than 0 [%] and less than 100 [%]) into which the refrigerant from the expansion valve EV1 and the refrigerant from the flow dividing valve EV2 are mixed has a smaller heat emission amount in the heat exchange unit HE than the case of using only the refrigerant from the expansion valve EV1. Thus, the temperature of the loading table PD may be increased.

Figure 6:
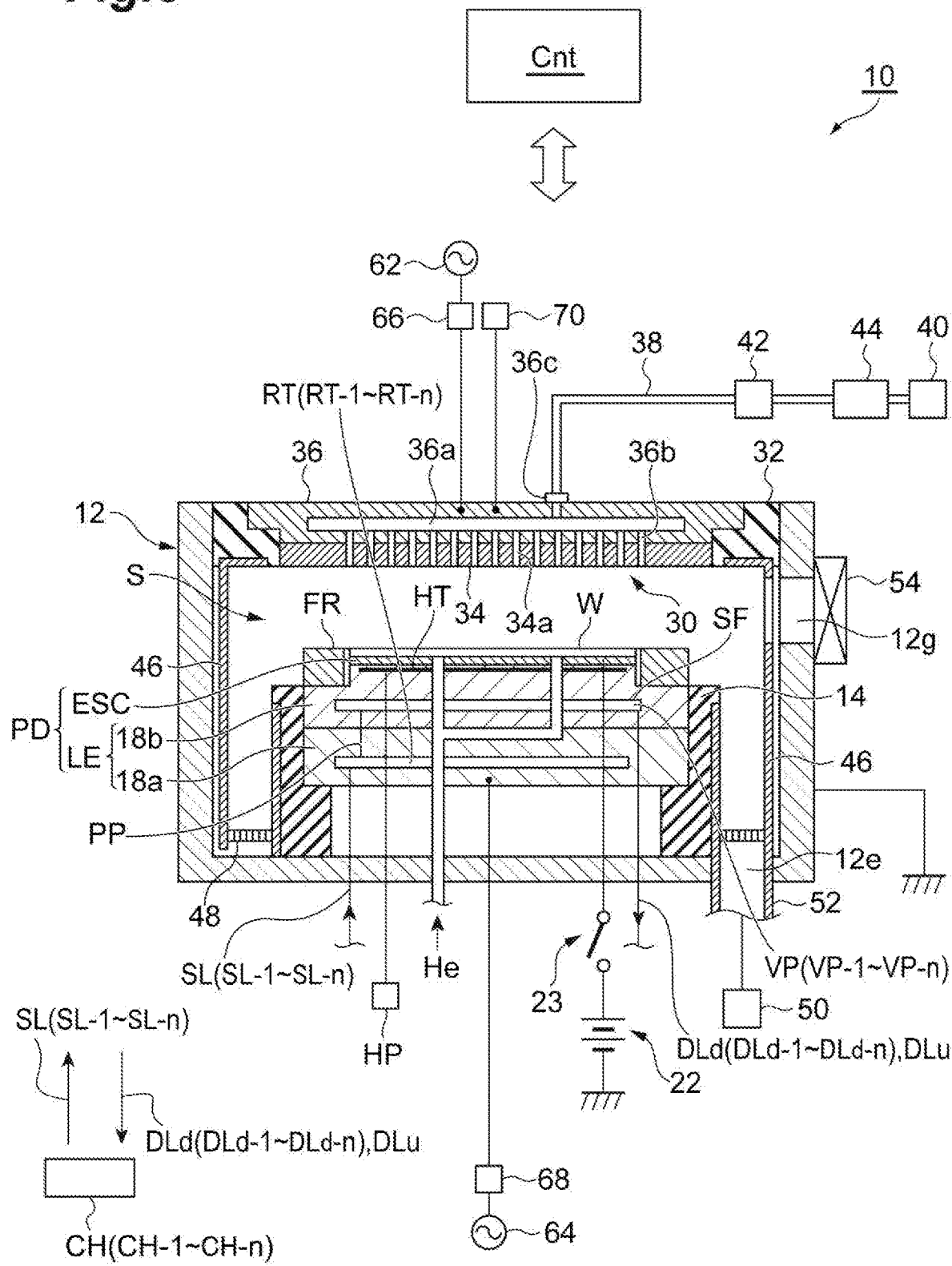
FIG. 6 is a diagram schematically illustrating one example of a configuration of a plasma processing apparatus in which the temperature adjustment system according to one exemplary embodiment of the present disclosure is used.

The temperature adjustment system CS illustrated in FIG. 1 may be applied to the plasma processing apparatus 10 illustrated in FIG. 6. The condensing device CD of the temperature adjustment system CS illustrated in FIG. 1 may be applied to the condensing device CD illustrated in each of FIG. 7, FIG. 10, FIG. 11, FIG. 15, and FIG. 16 and the condensing device CD-1 to the condensing device CD-n illustrated in FIG. 18.

Hereinafter, the temperature adjustment system CS according to each of a first example to a fifth example to which the condensing device CD illustrated in FIG. 1 can be applied will be described. The temperature adjustment system CS according to each of the first example to the fifth example may be used in the plasma processing apparatus 10 illustrated in FIG. 6. First, a configuration of the plasma processing apparatus 10 in which the temperature adjustment system CS according to each of the first example to the fifth example may be used will be described with reference to FIG. 6.

The plasma processing apparatus 10 illustrated in FIG. 6 is a plasma etching apparatus including flat parallel electrodes and includes the processing container 12. For example, the processing container 12 has an approximately cylindrical shape. For example, the processing container 12 has an aluminum material. An anodic oxidation process is performed on an inner wall surface of the processing container 12. The processing container 12 is protectively grounded.

A support unit 14 having an approximately cylindrical shape is disposed on a bottom part of the processing container 12. For example, the support unit 14 has an insulating material. The insulating material constituting the support unit 14 may include oxygen like quartz. In the processing container 12, the support unit 14 extends in the vertical direction (toward an upper electrode 30) from the bottom part of the processing container 12.

The loading table PD is disposed inside the processing container 12. The loading table PD is supported by the support unit 14. The loading table PD holds the wafer W on an upper surface of the loading table PD. The loading table PD includes a lower electrode LE and the electrostatic chuck ESC.

The lower electrode LE includes a first plate 18a and a second plate 18b. For example, the first plate 18a and the second plate 18b has a metal material such as aluminum and has an approximately disk-like shape. The second plate 18b is disposed on the first plate 18a and is electrically connected to the first plate 18a. The electrostatic chuck ESC is disposed on the second plate 18b.

The electrostatic chuck ESC has a structure in which an electrode that is a conductive film is arranged between a pair of insulating layers or a pair of insulating sheets. A direct current power supply 22 is electrically connected to the electrode of the electrostatic chuck ESC through a switch 23. The electrostatic chuck ESC attracts the wafer W by electrostatic force such as Coulomb force that occurs due to a direct current voltage from the direct current power supply 22. Accordingly, the electrostatic chuck ESC can hold the wafer W.

A focus ring FR is arranged to surround the edges of the wafer W and the electrostatic chuck ESC on a peripheral part of the second plate 18b. The focus ring FR is disposed in order to improve the uniformity of etching. The focus ring FR has a material that is appropriately selected based on the material of an etching target film, and may have, for example, quartz.

Figure 7:
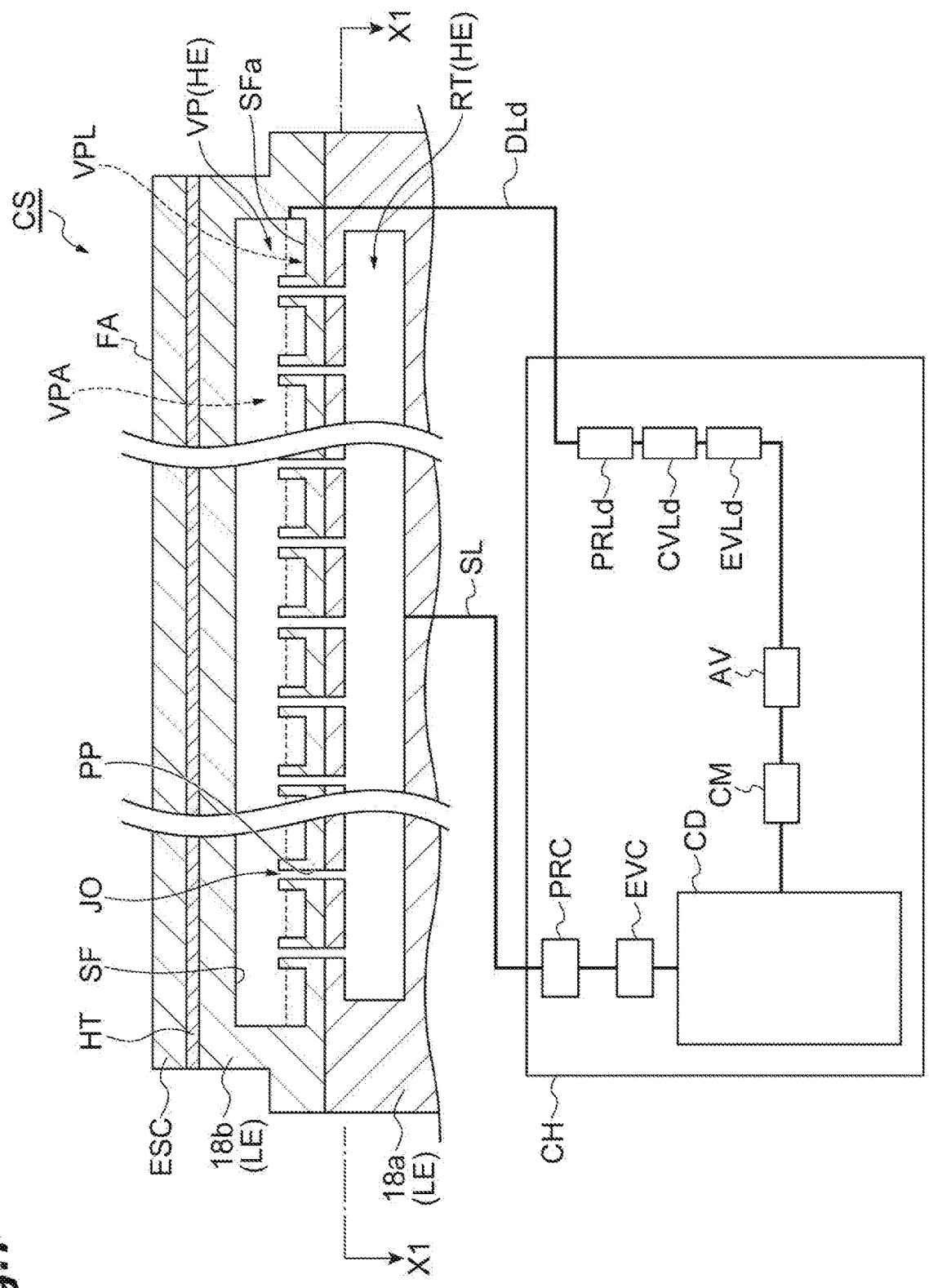
FIG. 7 is a diagram illustrating a configuration (first example) of the temperature adjustment system according to one exemplary embodiment of the present disclosure.
Figure 11:
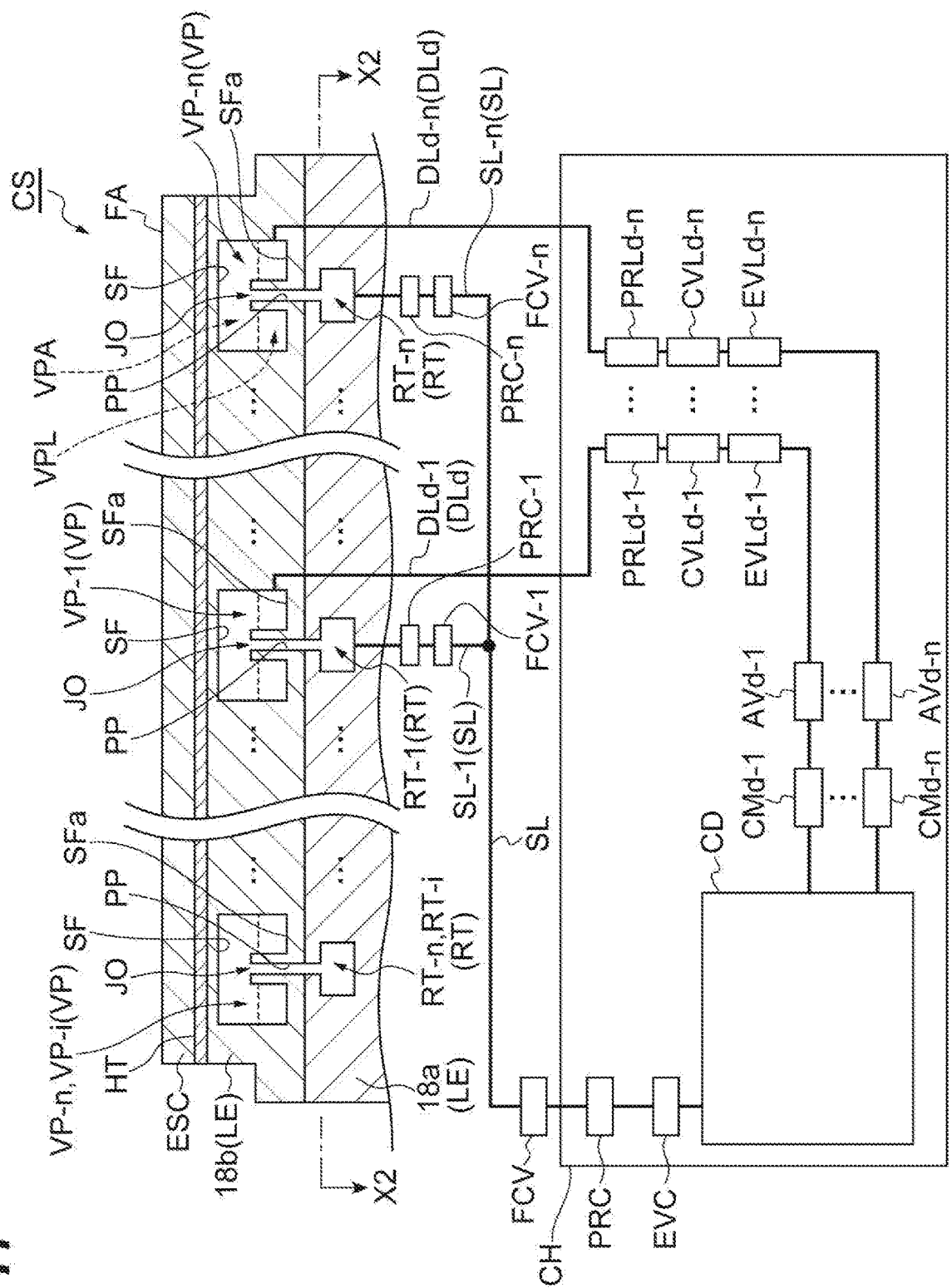
FIG. 11 is a diagram illustrating another configuration (second example) of the temperature adjustment system according to one exemplary embodiment of the present disclosure.
Figure 15:
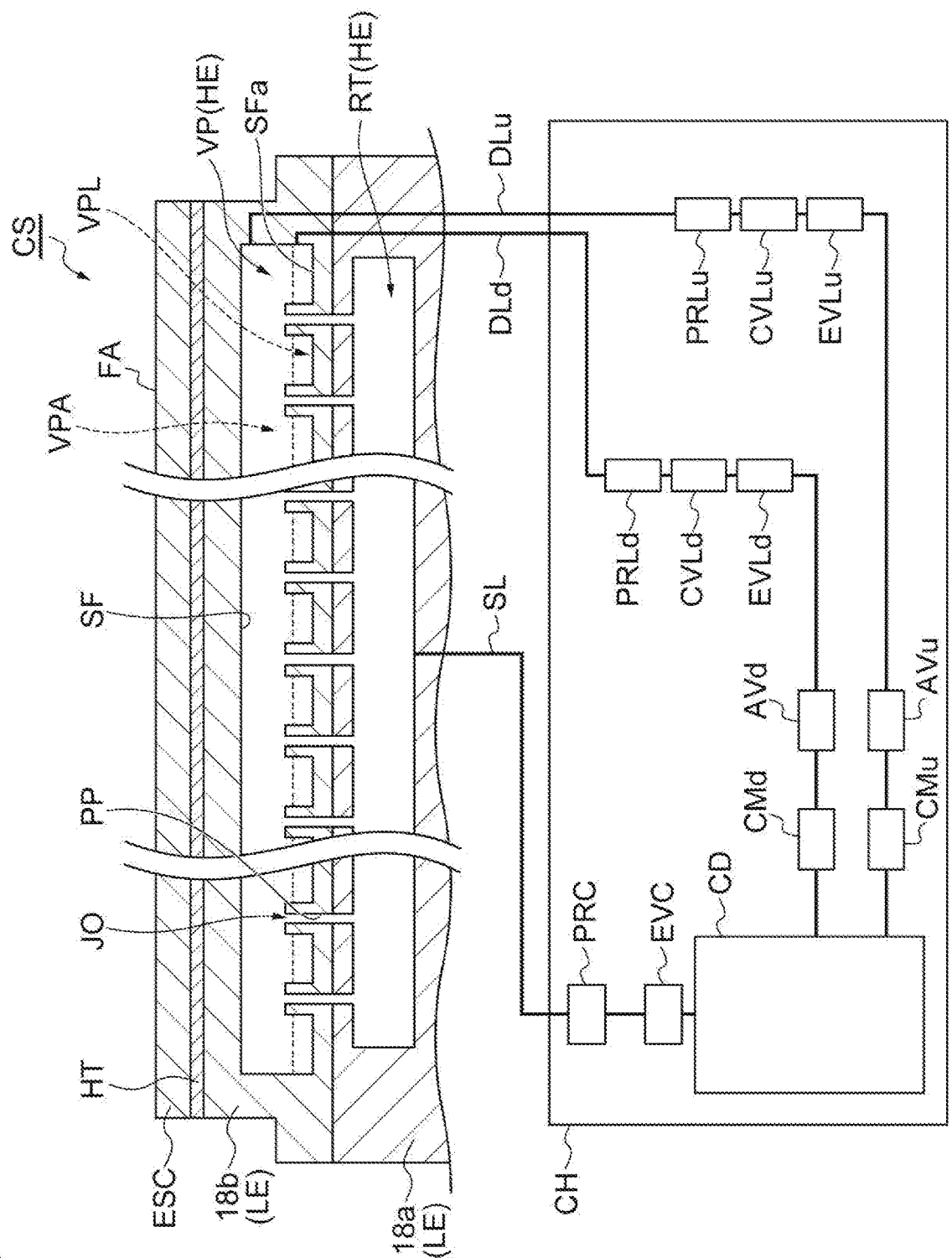
FIG. 15 is a diagram illustrating another configuration (third example) of the temperature adjustment system according to one exemplary embodiment of the present disclosure.
Figure 16:
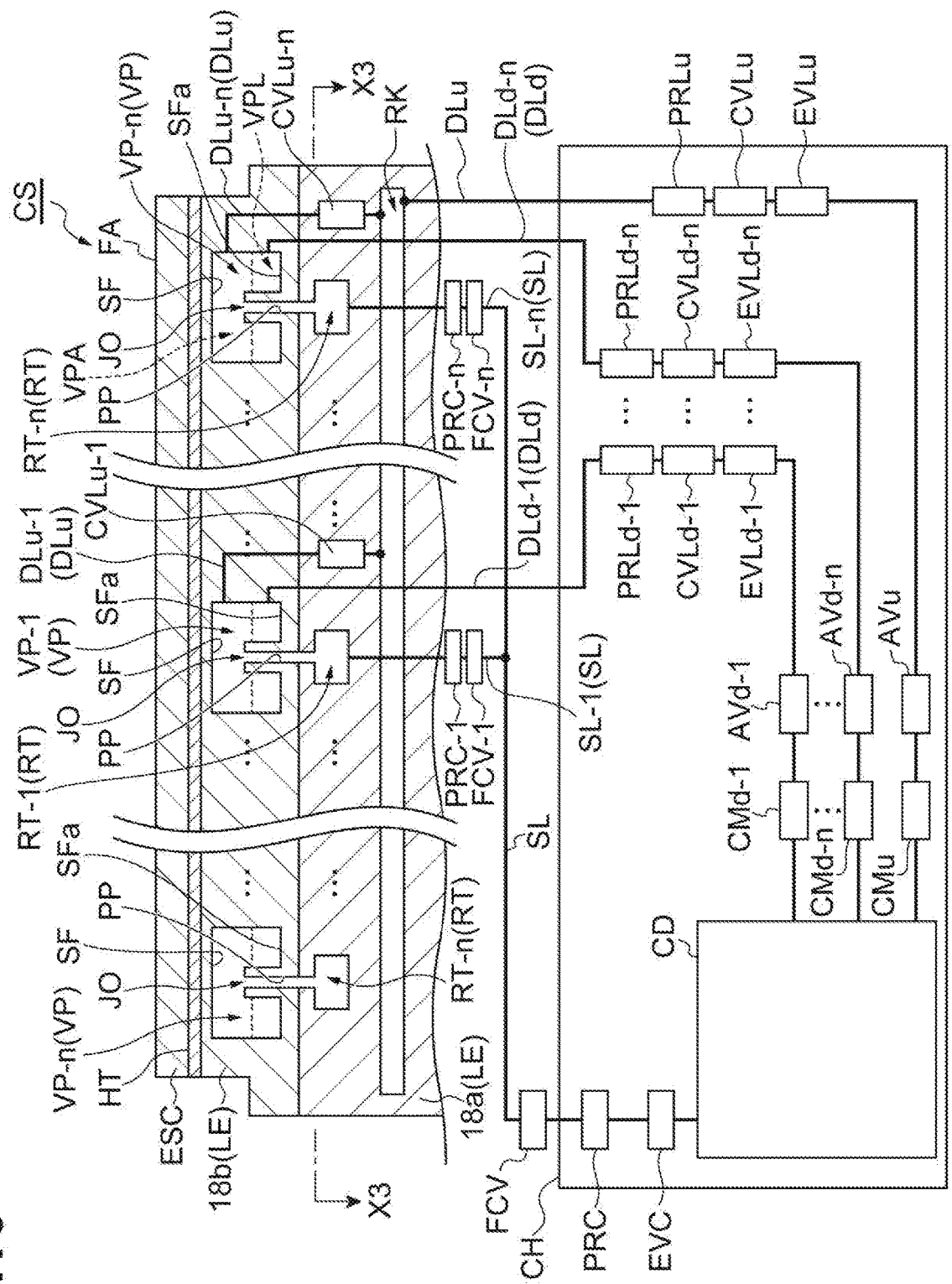
FIG. 16 is a diagram illustrating another configuration (fourth example) of the temperature adjustment system according to one exemplary embodiment of the present disclosure.
Figure 18:
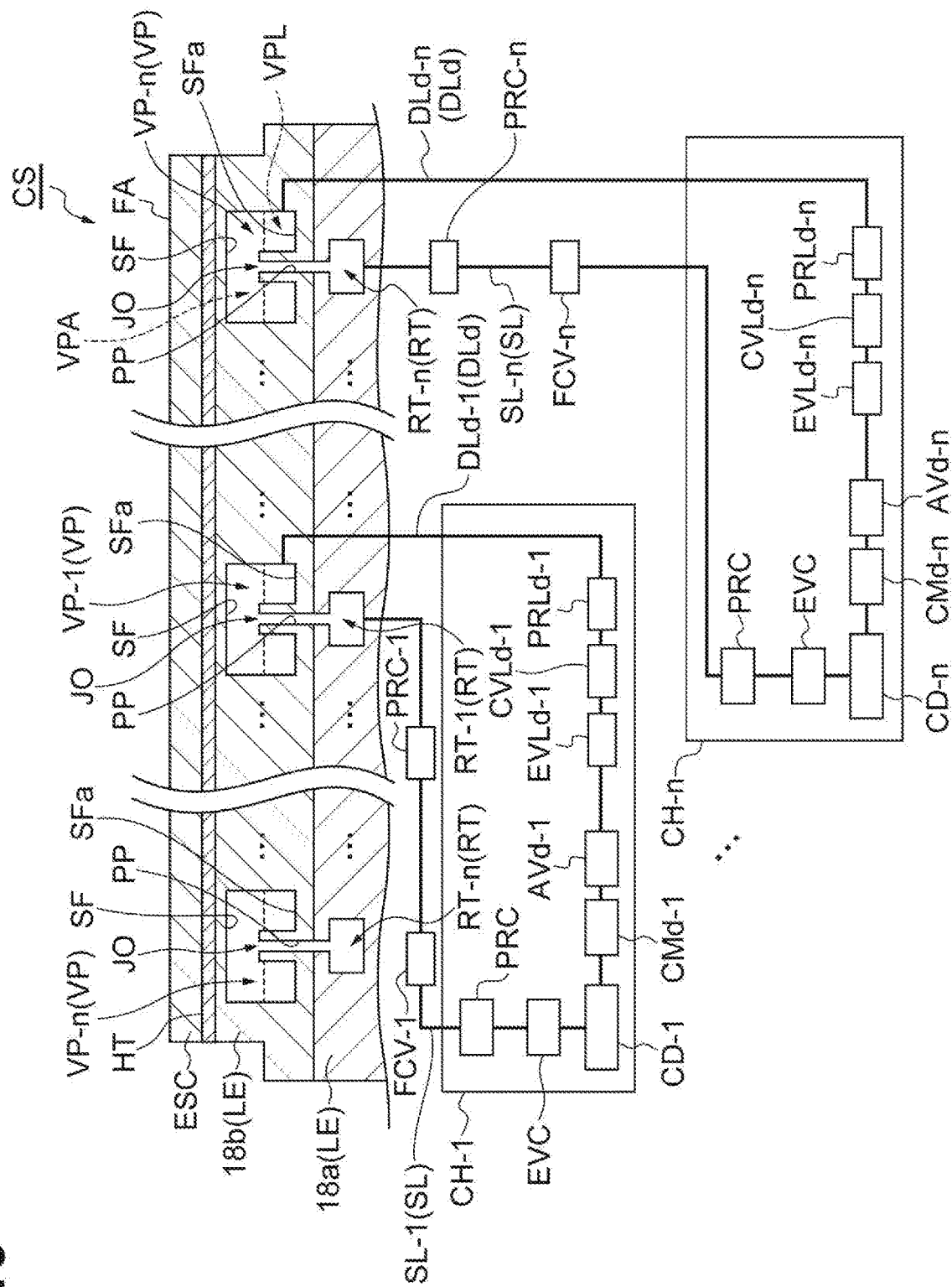
FIG. 18 is a diagram illustrating another configuration (fifth example) of the temperature adjustment system according to one exemplary embodiment of the present disclosure.

An evaporation chamber VP (or a divided chamber VP-1 to a divided chamber VP-n illustrated in FIG. 11, FIG. 16, and FIG. 18) illustrated in FIG. 7 and FIG. 15 is disposed inside the second plate 18b. By evaporating the refrigerant on a heat transfer wall SF of the evaporation chamber VP, the evaporation chamber VP may decrease the temperature of the electrostatic chuck ESC on the heat transfer wall SF of the evaporation chamber VP and cool the wafer W loaded on the electrostatic chuck ESC. A retention chamber RT (or a divided chamber RT-1 to a divided chamber RT-n illustrated in FIG. 11, FIG. 16, and FIG. 18) illustrated in FIG. 7 and FIG. 15 is disposed inside the first plate 18a. The retention chamber RT retains the refrigerant to be supplied to the evaporation chamber VP.

In the present specification, a phenomenon of a change in phase to vapor from either solid or liquid is referred to as "vaporization", and the occurrence of vaporization on only the surface of solid or liquid is referred to as "evaporation". Furthermore, the occurrence of vaporization from the inside of liquid is referred to as "boiling". In a case where the refrigerant is ejected and comes into contact with the heat transfer wall, the refrigerant evaporates to vapor from liquid. At this point, a heat amount called latent heat or vaporization heat moves to the refrigerant from the heat transfer wall.

The plasma processing apparatus 10 includes the chiller unit CH (or a chiller unit CH-1 to a chiller unit CH-n illustrated in FIG. 18) illustrated in FIG. 7, FIG. 11, FIG. 15, and FIG. 16. The chiller unit CH or the like decreases the temperature of the electrostatic chuck ESC and cools the wafer W loaded on the electrostatic chuck ESC by circulating the refrigerant through the supply line SL or the like, the retention chamber RT or the like, the evaporation chamber VP or the like, and the discharge line DLd or the like.

The refrigerant is supplied to the retention chamber RT or the like from the chiller unit CH or the like through the supply line SL (or a branch line SL-1 to a branch line SL-n illustrated in FIG. 11, FIG. 16, and FIG. 18). The refrigerant is discharged to the chiller unit CH or the like from the evaporation chamber VP or the like through the discharge line DLd (or a branch line DLd-1 to a branch line DLd-n illustrated in FIG. 11, FIG. 16, and FIG. 18 and a discharge line DLu illustrated in FIG. 15 and FIG. 16).

The plasma processing apparatus 10 includes the temperature adjustment system CS including the evaporation chamber VP or the like, the retention chamber RT or the like, and the chiller unit CH or the like. A specific configuration of the temperature adjustment system CS will be described below.

A gas supply line 28 is disposed in the plasma processing apparatus 10. The gas supply line 28 supplies heat transfer gas, for example, He gas, from a heat transfer gas supply mechanism to a space between an upper surface of the electrostatic chuck ESC and a rear surface of the wafer W.

The heater HT that is a heating element is disposed in the plasma processing apparatus 10. For example, the heater HT is embedded inside the second plate 18b. A heater power supply HP is connected to the heater HT.

By supplying power to the heater HT from the heater power supply HP, the temperature of the loading table PD is adjusted, and the temperature of the wafer W loaded on the loading table PD is adjusted. The heater HT may be incorporated in the electrostatic chuck ESC.

The plasma processing apparatus 10 includes the upper electrode 30. The upper electrode 30 is arranged to face the loading table PD above the loading table PD. The lower electrode LE and the upper electrode 30 are disposed approximately parallel to each other. A processing space S for performing a plasma process on the wafer W is provided between the upper electrode 30 and the lower electrode LE.

The upper electrode 30 is supported by an upper part of the processing container 12 through an insulating shield member 32. The insulating shield member 32 has an insulating material and may include oxygen like quartz. The upper electrode 30 may include an electrode plate 34 and an electrode support 36.

The electrode plate 34 abuts the processing space S. A plurality of gas ejection holes 34a are disposed in the electrode plate 34. In one exemplary embodiment, the electrode plate 34 contains silicon. In another exemplary embodiment, the electrode plate 34 may contain silicon oxide.

The electrode support 36 detachably supports the electrode plate 34 and may have a conductive material such as aluminum. The electrode support 36 may have a water cooling structure. A gas diffusion chamber 36a is disposed inside the electrode support 36.

A plurality of gas passage holes 36b that communicate with the gas ejection holes 34a extend downward (toward the loading table PD) from the gas diffusion chamber 36a. A gas introduction port 36c that guides processing gas to the gas diffusion chamber 36a is formed in the electrode support 36. A gas supply pipe 38 is connected to the gas introduction port 36c.

A gas source group 40 is connected to the gas supply pipe 38 through a valve group 42 and a flow rate controller group 44. The gas source group 40 includes a plurality of gas sources.

The valve group 42 includes a plurality of valves. The flow rate controller group 44 includes a plurality of flow rate controllers that are mass flow controllers. Each of the plurality of gas sources of the gas source group 40 is connected to the gas supply pipe 38 through the corresponding valve of the valve group 42 and the corresponding flow rate controller of the flow rate controller group 44.

Accordingly, the plasma processing apparatus 10 can supply gas from one or a plurality of gas sources selected from the plurality of gas sources of the gas source group 40 into the processing container 12 at an individually adjusted flow rate.

In the plasma processing apparatus 10, a deposit shield 46 is detachably disposed along an inner wall of the processing container 12. The deposit shield 46 is also disposed on an outer periphery of the support unit 14. The deposit shield 46 prevents an etching byproduct (deposit) from clinging to the processing container 12 and may have a structure in which an aluminum material is coated with ceramic such as $Y_2O_3$. In addition to $Y_2O_3$, the deposit shield may have a material including oxygen like quartz.

An exhaust plate 48 is disposed on a bottom part side (side on which the support unit 14 is installed) of the processing container 12 and between the support unit 14 and a side wall of the processing container 12. For example, the exhaust plate 48 may have a configuration in which an aluminum material is coated with ceramic such as $Y_2O_3$. An exhaust port 12e is disposed below the exhaust plate 48 in the processing container 12. An exhaust device 50 is connected to the exhaust port 12e through an exhaust pipe 52.

The exhaust device 50 includes a vacuum pump such as a turbomolecular pump and can depressurize the space in the processing container 12 to a desired vacuum degree. A transport in-and-out port 12g for the wafer W is disposed on the side wall of the processing container 12. The transport in-and-out port 12g can be open and closed by a gate valve 54.

The plasma processing apparatus 10 further includes a first high frequency power supply 62 and a second high frequency power supply 64. The first high frequency power supply 62 is a power supply that generates first high frequency power for generating plasma. High frequency power having a frequency of 27 to 100 [MHz], for example, 60 [MHz], is generated. The first high frequency power supply 62 is connected to the upper electrode 30 through a matcher 66. The matcher 66 is a circuit for matching an output impedance of the first high frequency power supply 62 and an input impedance on a load side (lower electrode LE side). The first high frequency power supply 62 may be connected to the lower electrode LE through the matcher 66.

The second high frequency power supply 64 is a power supply that generates second high frequency power for drawing ions into the wafer W, that is, high frequency bias power. High frequency bias power having a frequency in a range of 400 [kHz] to 40.68 [MHz], for example, a frequency of 13.56 [MHz], is generated. The second high frequency power supply 64 is connected to the lower electrode LE through a matcher 68. The matcher 68 is a circuit for matching an output impedance of the second high frequency power supply 64 and the input impedance on the load side (lower electrode LE side).

The plasma processing apparatus 10 further includes a power supply 70. The power supply 70 is connected to the upper electrode 30. A voltage for drawing positive ions present inside the processing space S into the electrode plate 34 is applied to the upper electrode 30 by the power supply 70. For example, the power supply 70 is a direct current power supply that generates a negative direct current voltage. In a case where such a voltage is applied to the upper electrode 30 from the power supply 70, positive ions present in the processing space S collide with the electrode plate 34. Accordingly, secondary electrons and/or silicon are discharged from the electrode plate 34.

In one exemplary embodiment, the plasma processing apparatus 10 may include the control unit Cnt illustrated in FIG. 1. The control unit Cnt is connected to the valve group 42, the flow rate controller group 44, the exhaust device 50, the first high frequency power supply 62, the matcher 66, the second high frequency power supply 64, the matcher 68, the power supply 70, the heater power supply HP, the chiller unit CH (or the chiller unit CH-1 to the chiller unit CH-n), and the like.

Using a control signal, the control unit Cnt can control selection and the flow rate of gas supplied from the gas source group 40, exhausting of the exhaust device 50, supply of power from the first high frequency power supply 62 and the second high frequency power supply 64, voltage application from the power supply 70, supply of power from the heater power supply HP, the flow rate of the refrigerant supplied to the evaporation chamber VP or the like from the chiller unit CH (or the chiller unit CH-1 to the chiller unit CH-n), and the like.

The control unit Cut causes the CPU to execute a computer program recorded in a recording device such as the ROM or the RAM. Particularly, the computer program includes a program for causing the CPU of the control unit Cnt to execute a recipe related to the plasma process performed in the plasma processing apparatus 10.

First Example

FIG. 7 is a diagram illustrating a configuration of the temperature adjustment system CS according to the first example. The temperature adjustment system CS includes the chiller unit CH, the supply line SL, the discharge line DLd (first discharge line), and the heat exchange unit HE.

The heat exchange unit HE includes the evaporation chamber VP, the retention chamber RT, and a plurality of pipes PP. The pipe PP includes an ejection port JO. The heat exchange unit HE is disposed inside the loading table PD and exchanges heat using the refrigerant through a loading surface FA of the loading table PD.

The retention chamber RT retains the refrigerant supplied from the chiller unit CH through the supply line SL. The retention chamber RT is connected to the chiller unit CH through the supply line SL and communicates with the evaporation chamber VP through the plurality of pipes PP.

The evaporation chamber VP evaporates the refrigerant retained in the retention chamber RT. The evaporation chamber VP is connected to the chiller unit CH through the discharge line DLd, extends along the loading surface FA of the loading table PD, and includes a plurality of ejection ports JO. The ejection port JO is disposed at one end of the pipe PP and is arranged such that the refrigerant is ejected from the pipe PP toward the heat transfer wall SF that is on the loading surface FA side among the inner walls of the evaporation chamber VP.

Figure 8:
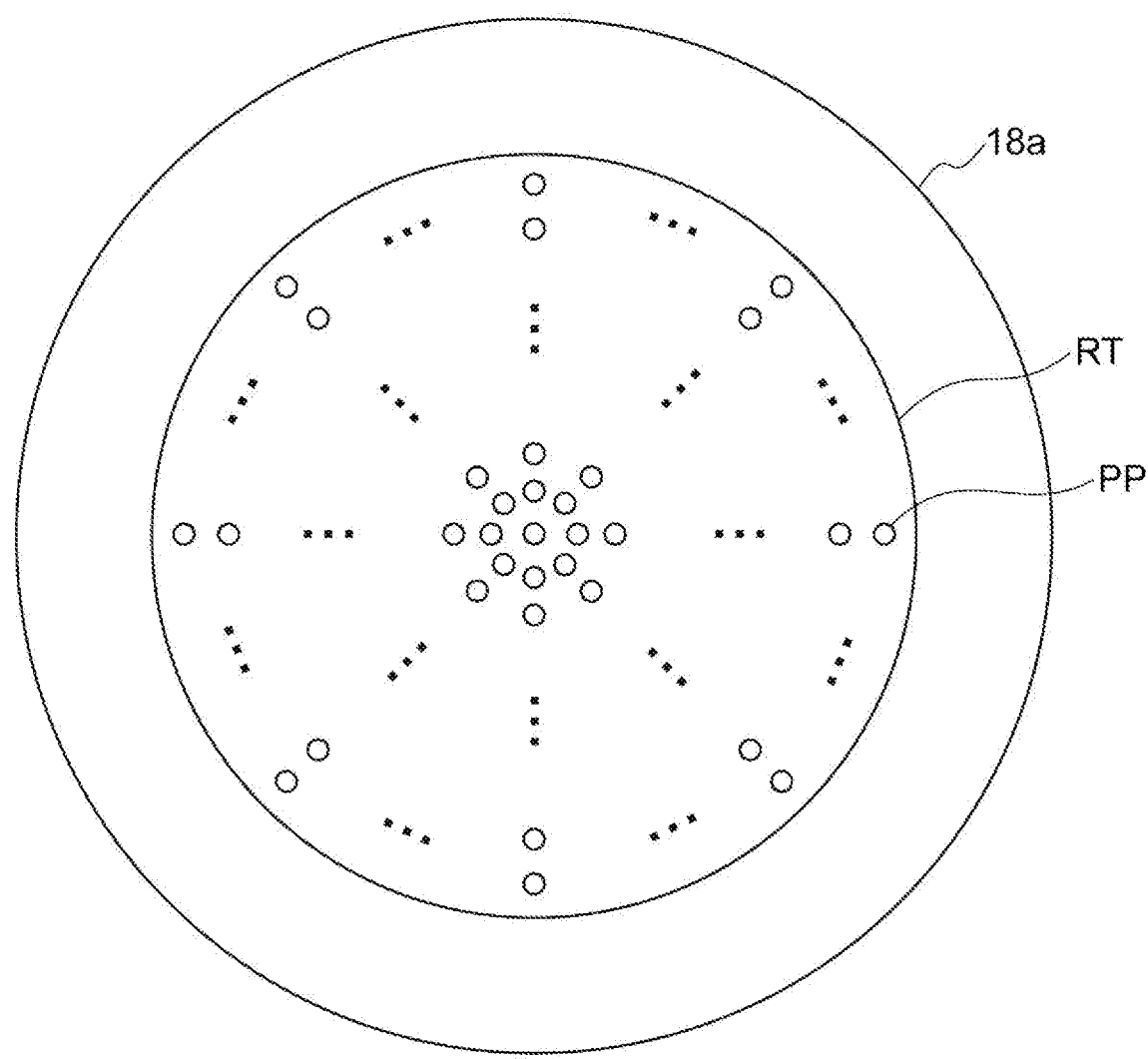
FIG. 8 is a diagram illustrating one aspect of a section of a lower electrode along line X1-X1 illustrated in FIG. 7.

FIG. 8 is a diagram illustrating one aspect of a section of the lower electrode LE along line X1-X1 illustrated in FIG. 7. In the section illustrated in FIG. 8, the plurality of pipes PP (that is, the plurality of ejection ports JO) are almost equidistantly arranged in a circumferential direction and a diametral direction of a circular section of the first plate 18*a* when seen above the loading surface FA. As illustrated in FIG. 8, the plurality of pipes PP (that is, the plurality of ejection ports JO) are arranged in a scattered manner across the loading surface FA when seen above the loading surface FA.

FIG. 7 will be described again. The chiller unit CH is connected to the heat exchange unit HE through the supply line SL for the refrigerant and the discharge line DLd for the refrigerant. The chiller unit CH supplies the refrigerant to the heat exchange unit HE through the supply line SL and discharges the refrigerant from the heat exchange unit HE through the discharge line DLd.

The chiller unit CH includes a pressure gauge PRLd, a check valve CVLd, an expansion valve EVLd, an adjustment valve AV, the compressor CM, the condensing device CD, an expansion valve EVC, and a pressure gauge PRC. The evaporation chamber VP is disposed in the second plate 18*b*, and the retention chamber RT is disposed in the first plate 18*a*.

The supply line SL, more specifically, connects the condensing device CD and the retention chamber RT. The discharge line DLd, more specifically, connects the condensing device CD and the evaporation chamber VP.

In the chiller unit CH, the expansion valve EVC and the pressure gauge PRC are serially disposed in the supply line SL in order from a condensing device CD side. In the chiller unit CH, the compressor CM, the adjustment valve AV, the expansion valve EVLd, the check valve CVLd, and the pressure gauge PRLd are serially disposed in the discharge line DLd in order from the condensing device CD side.

An outlet of the condensing device CD is connected to an inlet of the expansion valve EVC, and an outlet of the expansion valve EVC is connected to an inlet of the pressure gauge PRC. An outlet of the pressure gauge PRC is connected to the retention chamber RT.

An inlet of the condensing device CD is connected to an outlet of the compressor CM, and an inlet of the compressor CM is connected to an outlet of the adjustment valve AV. An inlet of the adjustment valve AV is connected to an outlet of the expansion valve EVLd, and an inlet of the expansion valve EVLd is connected to an outlet of the check valve CVLd.

An inlet of the check valve CVLd is connected to an outlet of the pressure gauge PRLd, and an inlet of the pressure gauge PRLd is connected to the discharge line DLd. The discharge line DLd is connected to a liquid puddle area VPL that extends below the ejection port JO in the evaporation chamber VP. The liquid puddle area VPL is an area inside the evaporation chamber VP from the surface of a bottom wall SFa exposed inside the evaporation chamber VP to the ejection port JO, and is a spatial area in which a liquid state refrigerant (refrigerant as a liquid) of the refrigerant ejected from the ejection port JO may puddle (the same applies below in the present specification). In the evaporation chamber VP, an area excluding the liquid puddle area VPL includes a vapor diffusion area VPA. The vapor diffusion area VPA extends above the ejection port JO in the evaporation chamber VP and is a spatial area in which a vapor state refrigerant (refrigerant as a vapor) of the refrigerant ejected from the ejection port JO may diffuse (the same applies below in the present specification).

The opening degree [%] of each of the expansion valve EVC, the adjustment valve AV, the expansion valve EVLd, and the check valve CVLd is controlled by the control unit Cnt.

Figure 9:
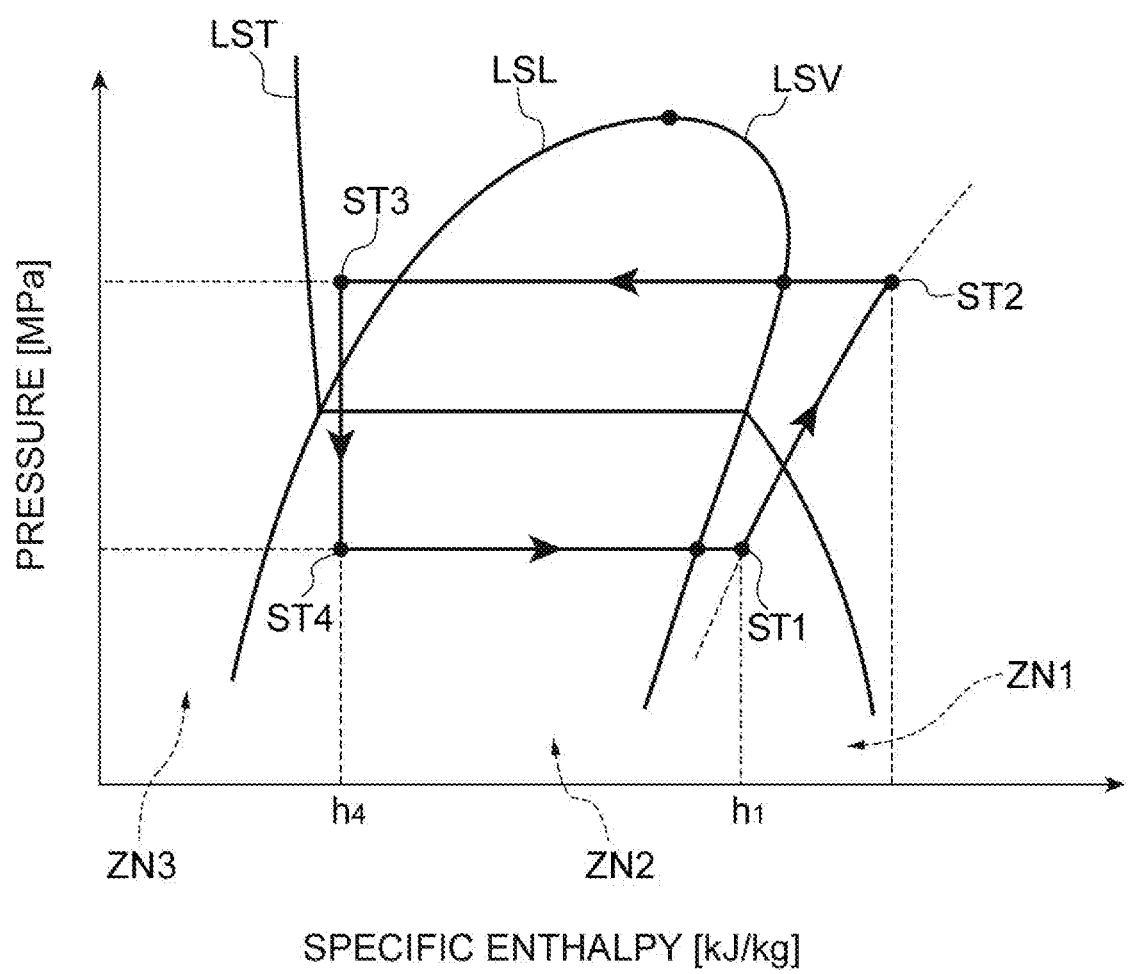
FIG. 9 is a diagram illustrating a Ph diagram (Mollier diagram) representing one example of the refrigeration cycle of the temperature adjustment system according to one exemplary embodiment of the present disclosure.
Figure 10:
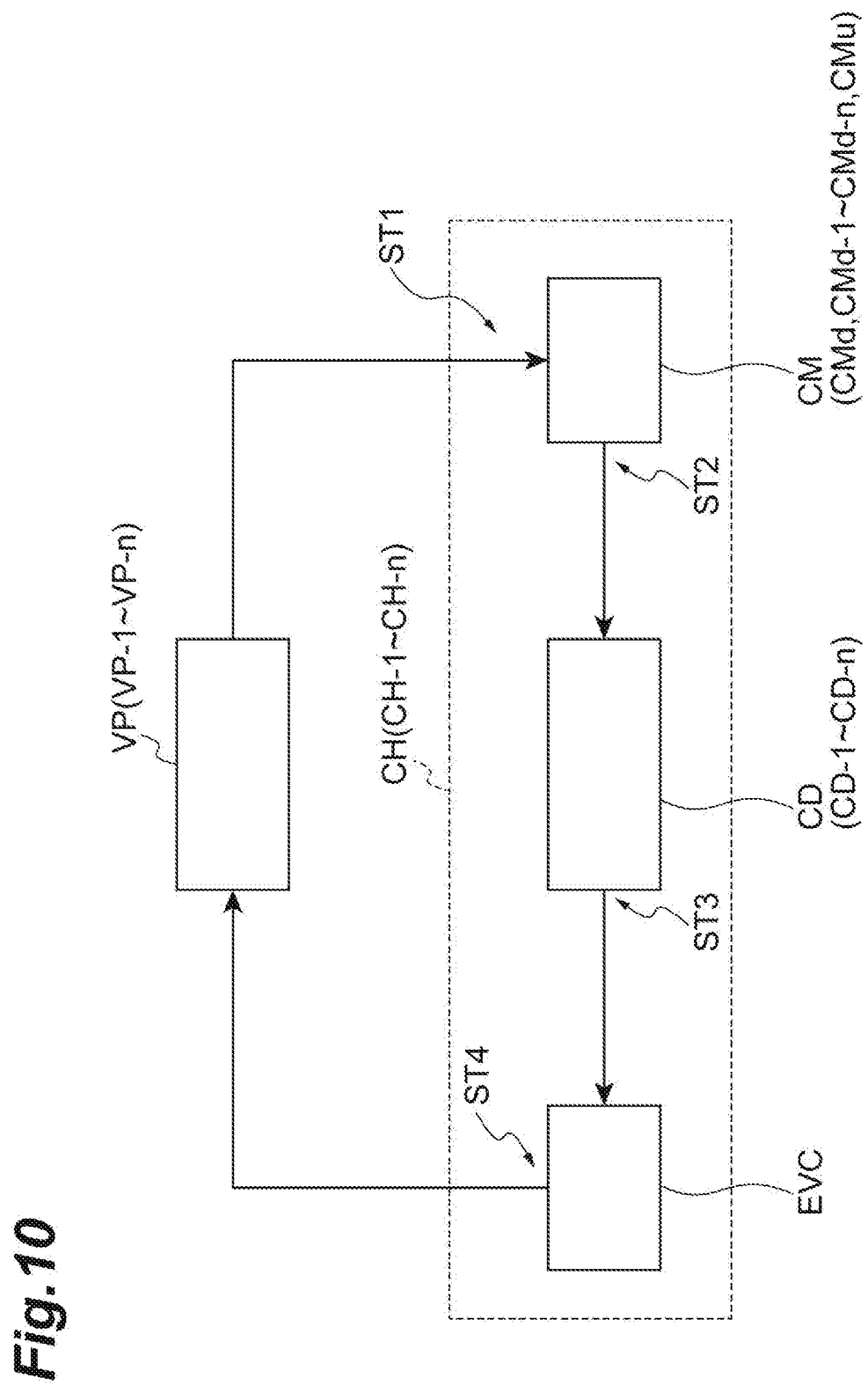
FIG. 10 is a diagram for describing the refrigeration cycle of the temperature adjustment system according to one exemplary embodiment of the present disclosure along with FIG. 9.

A refrigeration cycle of the temperature adjustment system CS will be described with reference to FIG. 9 and FIG. 10. FIG. 9 is a diagram illustrating a Ph diagram (Mollier diagram) representing the refrigeration cycle of the temperature adjustment system CS. FIG. 10 is a diagram for describing the refrigeration cycle of the temperature adjustment system CS along with FIG. 9.

First, the refrigerant discharged from the evaporation chamber VP (or the divided chamber VP-1 to the divided chamber VP-n illustrated in FIG. 11, FIG. 16, and FIG. 18) of the heat exchange unit HE reaches the inlet of the compressor CM (or the compressor CMd illustrated in FIG. 15, the compressor CMd-1 to the compressor CMd-n illustrated in FIG. 11, FIG. 16, and FIG. 18, or the compressor CMu illustrated in FIG. 16). The refrigerant is set to be in a state ST1. The state ST1 is in the superheated vapor area ZN1. The refrigerant is compressed along a constant specific entropy line by the compressor CM and reaches the outlet of the compressor CM. The refrigerant is set to be in a state ST2. The state ST2 is in the superheated vapor area ZN1.

The refrigerant discharged from the compressor CM is condensed along an isobar by the condensing device CD (or the condensing device CD-1 to the condensing device CD-n illustrated in FIG. 18) and traverses the saturated vapor line LSV and the saturated liquid line LSL. The refrigerant reaches the outlet of the condensing device CD and is set to be in a state ST3. The state ST3 is in the supercooling area ZN3. The refrigerant discharged from the condensing device CD is expanded along a constant specific enthalpy line by the expansion valve EVC and traverses the saturated liquid line LSL. The refrigerant reaches the outlet of the expansion valve EVC and is set to be in a state ST4. The state ST4 is in the wet vapor area ZN2.

In the Ph diagram illustrated in FIG. 9, isotherms are usually drawn at an interval of 10° C. across the supercooling area ZN3, the wet vapor area ZN2, and the superheated vapor area ZN1. An isotherm LST shown in FIG. 9 extends as a right downward curve similar to a vertical line in the supercooling area ZN3 along with an increase in specific enthalpy, bends at an intersection with the saturated liquid line LSL, extends as a horizontal straight line (as a line at a constant pressure) in the wet vapor area ZN2, bends again at an intersection with the saturated vapor line LSV, and extends as a right downward curve in the superheated vapor area ZN1. The isotherm LST shown in FIG. 9 is one example of such an isotherm. The refrigerant in the wet vapor area ZN2 is in an intermediate state during evaporation or condensation, and saturated liquid and saturated vapor coexist. In a theoretical refrigeration cycle, pressure and temperature are constant during evaporation or condensation.

The refrigerant (state ST4) that is discharged from the expansion valve EVC and is in a wet vapor state having a low pressure and a low temperature takes heat from the heat transfer wall SF and evaporates along an isobar by the evaporation chamber VP. The refrigerant traverses the saturated vapor line LSV and reaches the outlet of the evaporation chamber VP. In the theoretical refrigeration cycle, in a saturated state, a saturated temperature is set in a case where the pressure of the refrigerant is specified, and a saturated pressure is set in a case where the temperature is specified. Accordingly, an evaporation temperature of the refrigerant can be controlled by pressure.

In the evaporation chamber VP, the specific enthalpy of the refrigerant increases to h1 from h4 during an isothermal change (from ST4 to ST1). A heat amount Wr [kJ/kg] that refrigerant [1 kg] takes from a surrounding object to be cooled (heat transfer wall) is called a refrigeration effect. The heat amount Wr [kg] is equal to a heat amount that the refrigerant [1 kg] receives from the object to be cooled and is equal to the amount of increase in the specific enthalpy of the refrigerant from the inlet to the outlet of the evaporation chamber VP: h1−h4 [kJ/kg]. Thus, a relationship Wr=h1−h4 is established.

A refrigeration capacity Φ0 [kJ/s] (or [kW]) is obtained as the product of the heat amount Wr [Id/kg], which is the refrigeration effect, and a refrigerant circulation amount Qmr [kg/s] as in the following expression.

$$\Phi 0 = Qmr \times Wr = Qmr \times (h1-h4)$$

Each of Wr, h1, and h4 is defined as follows.
Wr: refrigeration effect [kJ/kg]
h1: specific enthalpy [kJ/kg] of refrigerant (superheated vapor) at outlet of evaporation chamber VP
h4: specific enthalpy [kJ/kg] of refrigerant (wet vapor) at inlet of evaporation chamber VP In addition, a capacity of the temperature adjustment system CS to cool the object to be cooled is called the refrigeration capacity. Accordingly, the refrigeration capacity is in a proportional relationship with the refrigeration effect of the refrigerant and the refrigerant circulation amount. In addition, even in a case where the evaporation chamber VP is divided into the divided chamber VP-1 to the divided chamber VP-n, the refrigeration capacity of each of the divided chamber VP-1 to the divided chamber VP-n may be controlled by adjusting the refrigerant circulation amount.

The temperature adjustment system CS exchanges heat in the evaporation chamber VP by the circulation of the refrigerant in the above refrigeration cycle illustrated in FIG. 9 and FIG. 10. The refrigeration cycle illustrated in FIG. 9 and FIG. 10 is implemented in the same manner not only in the first example but also in the second example to the fifth example described below.

Second Example

FIG. 11 is a diagram illustrating another configuration (second example) of the temperature adjustment system CS according to one exemplary embodiment. In the temperature adjustment system CS according to the second example, the evaporation chamber VP and the retention chamber RT of the first example are changed.

The evaporation chamber VP of the temperature adjustment system CS according to the second example includes a plurality of first divided chambers (the divided chamber VP-1 to the divided chamber VP-n). The divided chamber VP-1 to the divided chamber VP-n are separated from each other inside the second plate 18b of the loading table PD. The first divided chambers (the divided chamber VP-1 to the divided chamber VP-n) include the ejection ports JO and are arranged in a scattered manner across the loading surface FA when seen above the loading surface FA.

The retention chamber RT of the temperature adjustment system CS according to the second example includes a plurality of second divided chambers (the divided chamber RT-1 to the divided chamber RT-n). The divided chamber RT-1 to the divided chamber RT-n are separated from each other inside the first plate 18a of the loading table PD. The second divided chamber (the divided chamber RT-1 to the divided chamber RT-n) communicates with the first divided chamber through the pipe PP.

The discharge line DLd includes a plurality of first branch lines (the branch line DLd-1 to the branch line DLd-n). The branch line DLd-1 to the branch line DLd-n are connected to the divided chamber VP-1 to the divided chamber VP-n of the evaporation chamber VP, respectively.

The supply line SL includes a plurality of second branch lines (the branch line SL-1 to the branch line SL-n). One end of the supply line SL is connected to the condensing device CD of the chiller unit CH according to the second example. The branch line SL-1 to the branch line SL-n are disposed at another end of the supply line SL. That is, the supply line SL that extends from the chiller unit CH according to the second example branches into the branch line SL-1 to the branch line SL-n. The branch line SL-1 to the branch line SL-n are connected to the divided chamber RT-1 to the divided chamber RT-n of the retention chamber RT, respectively.

The chiller unit CH according to the second example includes the pressure gauge PRC and the expansion valve EVC. The pressure gauge PRC and the expansion valve EVC are disposed on the supply line SL. The expansion valve EVC is arranged between the condensing device CD and the pressure gauge PRC on the supply line SL.

The chiller unit CH according to the second example includes a plurality of pressure gauges PRLd (a pressure gauge PRLd-1 to a pressure gauge PRLd-n), a plurality of check valves CVLd (a check valve CVLd-1 to a check valve CVLd-n), a plurality of expansion valves EVLd (an expansion valve EVLd-1 to an expansion valve EVLd-n), a plurality of adjustment valves AV (an adjustment valve AVd-1 to an adjustment valve AVd-n), and a plurality of compressors CM (the compressor CMd-1 to the compressor CMd-n).

The compressor CMd-1 to the compressor CMd-n are disposed in the branch line DLd-1 to the branch line DLd-n, respectively. The adjustment valve AVd-1 to the adjustment valve AVd-n are disposed in the branch line DLd-1 to the branch line DLd-n, respectively.

The expansion valve EVLd-1 to the expansion valve EVLd-n are disposed in the branch line DLd-1 to the branch line DLd-n, respectively. The check valve CVLd-1 to the check valve CVLd-n are disposed in the branch line DLd-1 to the branch line DLd-n, respectively. The pressure gauge PRLd-1 to the pressure gauge PRLd-n are disposed in the branch line DLd-1 to the branch line DLd-n, respectively.

The condensing device CD according to the second example is connected to each of the compressor CMd-1 to the compressor CMd-n.

The compressor CMd-1 to the compressor CMd-n are connected to the adjustment valve AVd-1 to the adjustment valve AVd-n, respectively. The adjustment valve AVd-1 to the adjustment valve AVd-n are connected to the expansion valve EVLd-1 to the expansion valve EVLd-n, respectively.

The expansion valve EVLd-1 to the expansion valve EVLd-n are connected to the check valve CVLd-1 to the check valve CVLd-n, respectively. The check valve CVLd-1 to the check valve CVLd-n are connected to the pressure gauge PRLd-1 to the pressure gauge PRLd-n, respectively. The pressure gauge PRLd-1 to the pressure gauge PRLd-n are connected to the divided chamber VP-1 to the divided chamber VP-n, respectively.

The pressure gauge PRC of the chiller unit CH according to the second example is connected to a flow rate adjustment valve FCV on the supply line SL. The flow rate adjustment valve FCV is connected to the chiller unit CH according to the second example and the branch line SL-1 to the branch line SL-n. The flow rate adjustment valve FCV is arranged between the chiller unit CH and the branch line SL-1 to the branch line SL-n on the supply line SL.

A flow rate adjustment valve (each of a flow rate adjustment valve FCV-1 to a flow rate adjustment valve FCV-n) and a pressure gauge (each of a pressure gauge PRC-1 to a pressure gauge PRC-n) are disposed in each of the branch line SL-1 to the branch line SL-n. For example, the flow rate adjustment valve FCV-1 and the pressure gauge PRC-1 are disposed on the branch line SL-1. The flow rate adjustment valve FCV-n and the pressure gauge PRC-n are disposed on the branch line SL-n.

Each of the flow rate adjustment valve FCV-1 to the flow rate adjustment valve FCV-n is connected to the flow rate adjustment valve FCV. The pressure gauge PRC-1 to the pressure gauge PRC-n are connected to the flow rate adjustment valve FCV-1 to the flow rate adjustment valve FCV-n, respectively. The divided chamber RT-1 to the divided chamber RT-n are connected to the pressure gauge PRC-1 to the pressure gauge PRC-n, respectively.

The flow rate adjustment valve FCV-1 to the flow rate adjustment valve FCV-n are arranged between the flow rate adjustment valve FCV and the pressure gauge PRC-1 to the pressure gauge PRC-n, respectively. The pressure gauge PRC-1 to the pressure gauge PRC-n are arranged between the flow rate adjustment valve FCV-1 to the flow rate adjustment valve FCV-n and the divided chamber RT-1 to the divided chamber RT-n, respectively.

In the second example, first, the flow rate of the refrigerant that is output to the evaporation chamber VP (each of the divided chamber VP-1 to the divided chamber VP-n) from the chiller unit CH through the supply line SL may be generally adjusted by adjusting the opening degree [%] of the flow rate adjustment valve FCV. Then, the flow rate in each of the branch line SL-1 to the branch line SL-n (the flow rate of the refrigerant supplied to each of the divided chamber RT-1 to the divided chamber RT-n) may be individually adjusted by adjusting the opening degree [%] of each of the flow rate adjustment valve FCV-1 to the flow rate adjustment valve FCV-n.

The opening degree [%] of each of the flow rate adjustment valve FCV, the flow rate adjustment valve FCV-1 to the flow rate adjustment valve FCV-n, the adjustment valve AVd-1 to the adjustment valve AVd-n, the expansion valve EVLd-1 to the expansion valve EVLd-n, and the check valve CVLd-1 to the check valve CVLd-n is controlled by the control unit Cnt.

Figure 12:
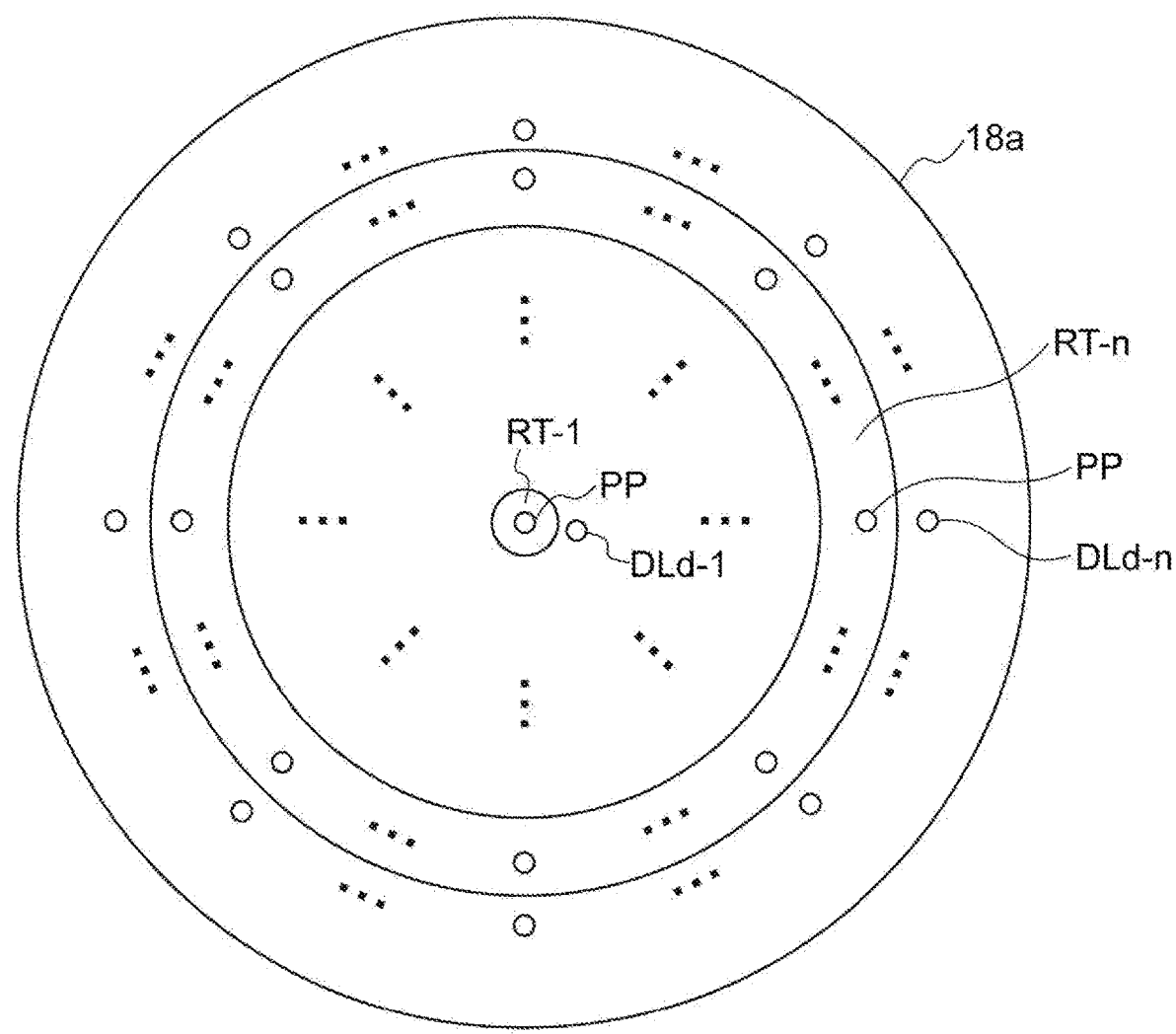
FIG. 12 is a diagram illustrating one aspect of a section of the lower electrode along line X2-X2 illustrated in FIG. 11.
Figure 13:
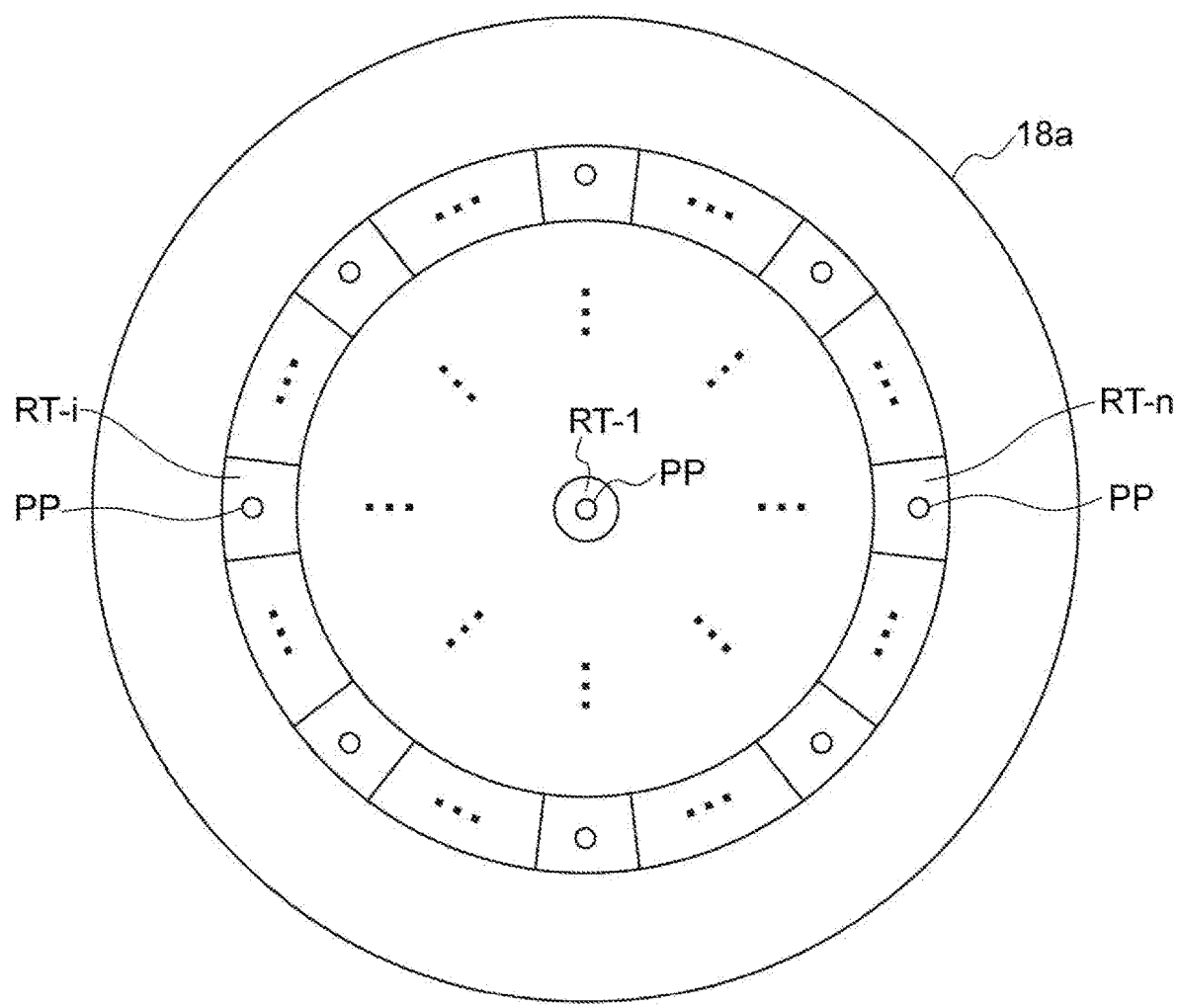
FIG. 13 is a diagram illustrating another aspect of the section of the lower electrode along line X2-X2 illustrated in FIG. 11.

FIG. 12 is a diagram illustrating one aspect of a section of the lower electrode LE along line X2-X2 illustrated in FIG. 11. FIG. 13 is a diagram illustrating another aspect of the section of the lower electrode LE along line X2-X2 illustrated in FIG. 11.

As illustrated in FIG. 12, the divided chamber RT-1 to the divided chamber RT-n are separated from each other. In the section illustrated in FIG. 12, the divided chamber RT-1 to the divided chamber RT-n are arranged in order in the diametral direction toward the outer circumference from the center of the circular section of the first plate 18a when seen above the loading surface FA. In the section illustrated in FIG. 12, when seen above the loading surface FA, the divided chamber RT-1 has a circular section, and a divided chamber (for example, the divided chamber RT-n) outside the divided chamber RT-1 has a band-like section.

As illustrated in FIG. 12, when seen above the loading surface FA, the plurality of pipes PP (that is, the plurality of ejection ports JO) are arranged in a scattered manner across the loading surface FA. As illustrated in FIG. 12, the discharge line DLd (the branch line DLd-1 to the branch line DLd-n) connected to the divided chamber (the divided chamber VP-1 to the divided chamber VP-n) communicating with the pipe PP is arranged near each of the plurality of pipes PP.

The divided chamber (for example, a divided chamber RT-i and the divided chamber RT-n; i is an integer in a range of 1<i<N) outside the divided chamber RT-1 is not limited to the case of having a band-like section illustrated in FIG. 12 and may have a section in which the band-like section is further divided and separated into a plurality of sections in the circumferential direction as illustrated in FIG. 13.

FIG. 14 is a diagram for illustratively describing an operation of the temperature adjustment system CS illustrated in FIG. 11. The operation (an operation PT1 and an operation PT3) illustrated in FIG. 14 may also be applied to the temperature adjustment system CS (the fourth example and the fifth example) illustrated in each of FIG. 16 and FIG. 18 described below.

The operation illustrated in FIG. 14 may be controlled by the control unit Cnt. The operation illustrated in FIG. 14 is an operation of each of the flow rate adjustment valve FCV-1 to the flow rate adjustment valve FCV-n and is an operation of changing the opening degree [%] of each of the flow rate adjustment valve FCV-1 to the flow rate adjustment valve FCV-n in response to an elapse of a period such as a period T1 or a period T2. For example, the period T2 is a period subsequent to the period T1. In each period such as the period T1, the total of the opening degrees [%] of the flow rate adjustment valve FCV-1 to the flow rate adjustment valve FCV-n is equal to 100 [%].

The operation PT1 is an operation of suitably changing the opening degrees [%] of the flow rate adjustment valve FCV-1 to the flow rate adjustment valve FCV-n in response to an elapse of a period such as the period T1 or the period T2. In the operation PT1, for example, from a state where the opening degree [%] of the flow rate adjustment valve FCV-1 is set to 30 [%], and the opening degree [%] of the flow rate adjustment valve FCV-n is set to 10 [%] in the period T1, the opening degree [%] of the flow rate adjustment valve FCV-1 is changed to 20 [%], and the opening degree [%] of the flow rate adjustment valve FCV-n is changed to 5 [%] in the period T2 subsequent to the period T1.

The operation PT2 is an operation of fixing the opening degree [%] of each of the flow rate adjustment valve FCV-1 to the flow rate adjustment valve FCV-n in all periods (period T1 and the like). In the operation PT2, for example, in all periods (period T1 and the like), the opening degree [%] of the flow rate adjustment valve FCV-1 is fixed to 50 [%], and the opening degree [%] of the flow rate adjustment valve FCV-n is fixed to 20 [%]. By fixing the opening degree of each flow rate adjustment valve and adjusting the refrigerant circulation amount, the refrigeration capacity of each divided chamber can be controlled in any manner even in a case where the heat input during the plasma process is not uniform. The operation PT2 is a specific example of the operation PT1.

An operation PT3 is an operation of setting only any one flow rate adjustment valve of the flow rate adjustment valve FCV-1 to the flow rate adjustment valve FCV-n to 100 [%] for each period such as the period T1 or the period T2. In the operation PT3, for example, in the period T1, the opening degree [%] of the flow rate adjustment valve FCV-1 is set to 100 [%]. In the period T2 subsequent to the period T1, the opening degree [%] of the flow rate adjustment valve FCV-n is set to 100 [%]. By adjusting the period of time for supplying the refrigerant for a divided chamber of which the temperature is to be adjusted, the refrigerant capacity of each divided chamber can be controlled in any manner even in a case where the heat input during the plasma process is not uniform. The operation PT3 is a specific example of the operation PT1.

Third Example

FIG. 15 is a diagram illustrating another configuration (third example) of the temperature adjustment system CS according to one exemplary embodiment. The temperature adjustment system CS according to the third example has a configuration in which the discharge line DLu (second discharge line) is added to the first example.

The discharge line DLu connects the evaporation chamber VP and the chiller unit CH. More specifically, the discharge line DLu connects the evaporation chamber VP and the condensing device CD of the chiller unit CH and is connected to the vapor diffusion area VPA extending above the ejection port JO in the evaporation chamber VP.

The chiller unit CH according to the third example further includes a pressure gauge PRLu, a check valve CVLu, an expansion valve EVLu, an adjustment valve AVu, and the compressor CMu. The compressor CMu, the adjustment valve AVu, the expansion valve EVLu, the check valve CVLu, and the pressure gauge PRLu are disposed in the discharge line DLu.

The condensing device CD according to the third example is connected to the compressor CMu. The compressor CMu is connected to the adjustment valve AVu. The adjustment valve AVu is connected to the expansion valve EVLu. The expansion valve EVLu is connected to the check valve CVLu. The check valve CVLu is connected to the pressure gauge PRLu. The pressure gauge PRLu is connected to the evaporation chamber VR The functions of the pressure gauge PRLu, the check valve CVLu, the expansion valve EVLu, the adjustment valve AVu, and the compressor CMu are the same as the functions of the pressure gauge PRLd, the check valve CVLd, the expansion valve EVLd, the adjustment valve AVd, and the compressor CMd, respectively.

The opening degree [%] of each of the adjustment valve AVu, the expansion valve EVLu, and the check valve CVLu is controlled by the control unit Cnt.

Fourth Example

FIG. 16 is a diagram illustrating another configuration (fourth example) of the temperature adjustment system CS according to one exemplary embodiment. The temperature adjustment system CS according to the fourth example has a configuration in which the discharge line DLu is added to the second example. The discharge line DLu according to the fourth example includes a branch line DLu-1 to a branch line DLu-n.

The branch line DLu-1 to the branch line DLu-n are connected to the divided chamber VP-1 to the divided chamber VP-n, respectively. A check valve CVLu-1 to a check valve CVLu-n are disposed in the branch line DLu-1 to the branch line DLu-n, respectively.

The check valve CVLu-1 to the check valve CVLu-n may be disposed inside the first plate 18a or may be disposed outside the lower electrode LE. The opening degree [Vo] of each of the check valve CVLu-1 to the check valve CVLu-n is controlled by the control unit Cnt.

The divided chamber VP-1 to the divided chamber VP-n are connected to a retention chamber RK disposed in the first plate 18a through the branch line DLu-1 to the branch line DLu-n, respectively. The retention chamber RK is connected to the chiller unit CH through the discharge line DLu. The discharge line DLu (including the branch line DLu-1 to the branch line DLu-n) connects each of the divided chamber VP-1 to the divided chamber VP-n and the chiller unit CH according to the fourth example through the retention chamber RK.

The refrigerant discharged from each of the divided chamber VP-1 to the divided chamber VP-n is retained in the retention chamber RK through each of the branch line DLu-1 to the branch line DLu-n. The refrigerant retained in the retention chamber RK is sent to the chiller unit CH from the retention chamber RK through the discharge line DLu connected to the retention chamber RK.

In the same manner as the third example, the chiller unit CH according to the fourth example further includes the pressure gauge PRLu, the check valve CVLu, the expansion valve EVLu, the adjustment valve AVu, and the compressor CMu that are connected to the discharge line DLu. The pressure gauge PRLu, the check valve CVLu, the expansion valve EVLu, the adjustment valve AVu, and the compressor CMu according to the fourth example are the same as those in the case of the third example.

Figure 17:
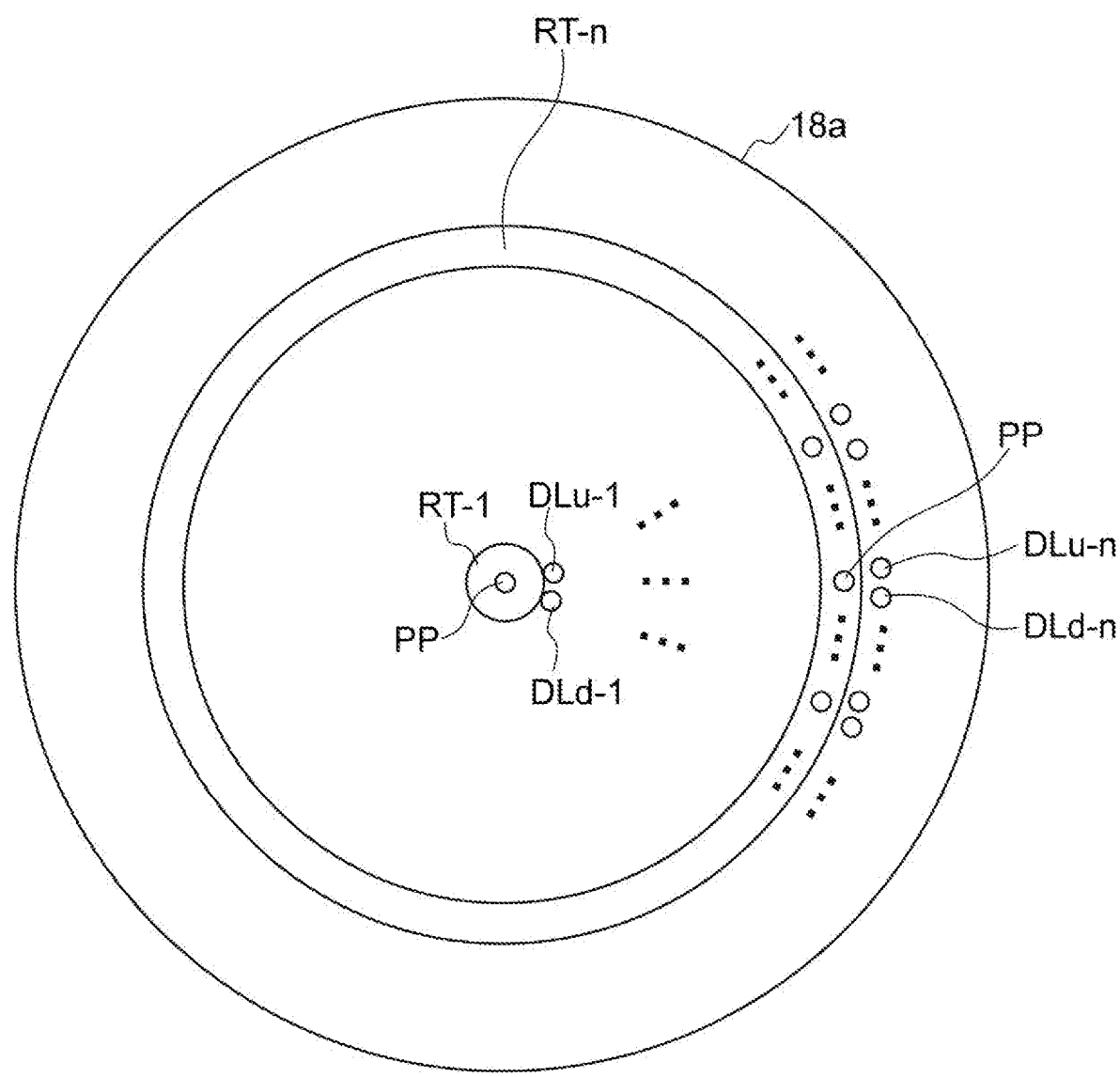
FIG. 17 is a diagram illustrating one aspect of a section of the lower electrode along line X3-X3 illustrated in FIG. 16.

FIG. 17 is a diagram illustrating one aspect of a section of the lower electrode LE along line X3-X3 illustrated in FIG. 16. As illustrated in FIG. 17, in the fourth example, the shapes and the arrangement of the divided chamber RT-1 to the divided chamber RT-n, the arrangement of the pipes PP, and the arrangement of the branch line DLd-1 to the branch line DLd-n are the same as those in the case of the second example illustrated in FIG. 12.

Furthermore, as illustrated in FIG. 17, in the fourth example, the discharge line DLu (the branch line DLu-1 to the branch line DLu-n) connected to the divided chamber (the divided chamber VP-1 to the divided chamber VP-n) communicating with the pipe PP is arranged near each of the plurality of pipes PP.

Fifth Example

FIG. 18 is a diagram illustrating another configuration (fifth example) of the temperature adjustment system CS according to one exemplary embodiment. The temperature adjustment system CS according to the fifth example includes a plurality of chiller units (the chiller unit CH-1 to the chiller unit CH-n). Each of the chiller unit CH-1 to the chiller unit CH-n has the same function as the chiller unit CH of the second example. Particularly, each of the chiller unit CH-1 to the chiller unit CH-n (for example, the chiller unit CH-1) supplies and discharges the refrigerant with respect to a set of the second divided chamber and the first divided chamber that communicate with each other (for example, with respect to the divided chamber RT-1 and the divided chamber VP-1 that are connected to the chiller unit CH-1).

The chiller unit CH-1 to the chiller unit CH-n include the condensing device CD-1 to the condensing device CD-n, respectively. Each of the condensing device CD-1 to the condensing device CD-n according to the fifth example has the same function as the condensing device CD according to each of the first example to the fourth example.

The branch line SL-1 to the branch line SL-n are connected to the divided chamber RT-1 to the divided chamber RT-n, respectively, and are connected to the condensing device CD-1 to the condensing device CD-n, respectively. For example, the branch line SL-1 connects the divided chamber RT-1 and the condensing device CD-1 of the chiller unit CH-1.

The branch line DLd-1 to the branch line DLd-n are connected to the divided chamber VP-1 to the divided chamber VP-n, respectively, and are connected to the condensing device CD-1 to the condensing device CD-n, respectively. For example, the branch line DLd-1 connects the divided chamber VP-1 and the condensing device CD-1 of the chiller unit CH-1.

Each of the chiller unit CH-1 to the chiller unit CH-n includes the expansion valve EVC and the pressure gauge PRC.

The chiller unit CH-1 to the chiller unit CH-n include the compressor CMd-1 to the compressor CMd-n, respectively, and include the adjustment valve AVd-1 to the adjustment valve AVd-n, respectively.

The chiller unit CH-1 to the chiller unit CH-n include the expansion valve EVLd-1 to the expansion valve EVLd-n, respectively, include the check valve CVLd-1 to the check valve CVLd-n, respectively, and include the pressure gauge PRLd-1 to the pressure gauge PRLd-n, respectively.

The condensing device CD-1 to the condensing device CD-n are connected to the expansion valve EVC and are connected to the compressor CMd-1 to the compressor CMd-n, respectively.

In the same manner as the second example, the temperature adjustment system CS according to the fifth example includes the flow rate adjustment valve FCV-1 to the flow rate adjustment valve FCV-n and the pressure gauge PRC-1 to the pressure gauge PRC-n. The flow rate adjustment valve FCV-1 to the flow rate adjustment valve FCV-n are disposed in the branch line SL-1 to the branch line SL-n, respectively. The pressure gauge PRC-1 to the pressure gauge PRC-n are disposed in the branch line SL-1 to the branch line SL-n, respectively. The flow rate adjustment valve FCV-1 to the flow rate adjustment valve FCV-n are disposed between the chiller unit CH-1 to the chiller unit CH-n and the pressure gauge PRC-1 to the pressure gauge PRC-n, respectively. The pressure gauge PRC-1 to the pressure gauge PRC-n are disposed between the flow rate adjustment valve FCV-1 to the flow rate adjustment valve FCV-n and the divided chamber RT-1 to the divided chamber RT-n, respectively. By adjusting the opening degree [%] of each of the flow rate adjustment valve FCV-1 to the flow rate adjustment valve FCV-n, the flow rate of the refrigerant respectively supplied to the divided chamber RT-1 to the divided chamber RT-n from the chiller unit CH-1 to the chiller unit CH-n may be adjusted.

Figure 19:
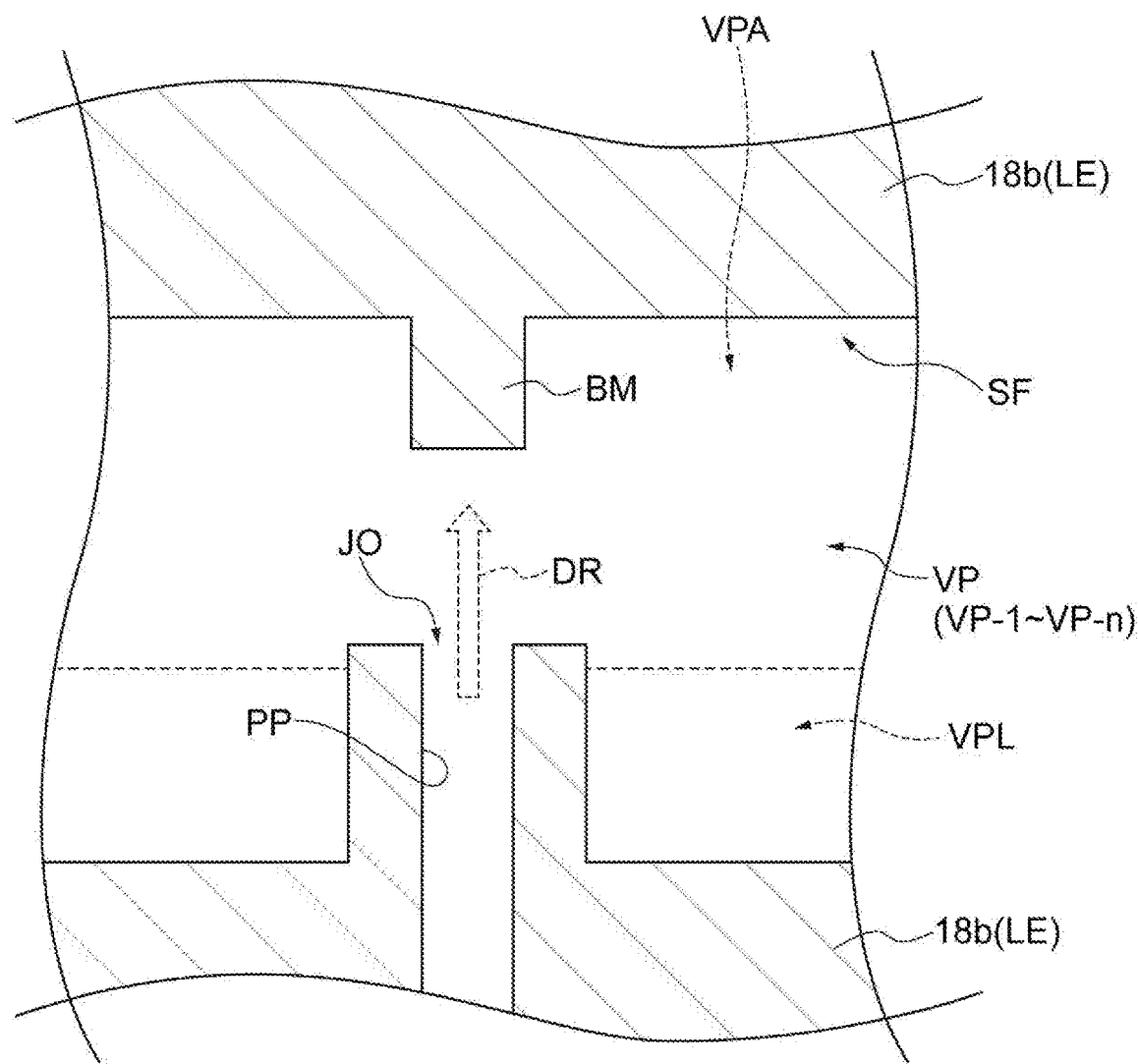
FIG. 19 is a diagram illustrating a main configuration of an evaporation chamber included in the temperature adjustment system illustrated in each of FIG. 7, FIG. 11, FIG. 15, FIG. 16, and FIG. 18.

FIG. 19 is a diagram illustrating a main configuration of the evaporation chamber VP (furthermore, the divided chamber VP-1 to the divided chamber VP-n) included in the temperature adjustment system CS illustrated in each of FIG. 7, FIG. 11, FIG. 15, FIG. 16, and FIG. 18. A plurality of protruding parts BM are disposed on the heat transfer wall SF of the evaporation chamber VP. The protruding part BM is disposed on the heat transfer wall SF of each of the divided chamber VP-1 to the divided chamber VP-n. The protruding part BM is integrated with the heat transfer wall SF and has relatively high thermal conductivity in the same manner as the heat transfer wall SF.

The protruding part BM is arranged such that the ejection port JO of the pipe PP faces the protruding part BM. The refrigerant is ejected in an ejection direction DR from the ejection port JO, and the refrigerant is sprayed on the protruding part BM. The refrigerant sprayed on the protruding part BM may receive heat from the protruding part BM and the heat transfer wall SF. Since the heat of the protruding part BM and the heat transfer wall SF moves to the refrigerant due to the refrigerant sprayed on the protruding part BM, heat may be emitted from the loading surface FA by the refrigerant.

The same effect as the case of using the protruding part BM may be achieved by using not only the case of disposing the protruding part BM in the heat transfer wall SF but also the case of disposing a pole-like fin (pole-like fin having a diameter of 1.0 to 5.0 [mm] and a height of 1.0 to 5.0 [mm]) in the heat transfer wall SF, the case of disposing a dimple (dimple having a diameter of 1.0 to 5.0 [mm] and a depth of 1.0 to 5.0 [mm]) in the heat transfer wall SF, the case of increasing the surface roughness of the heat transfer wall SF (surface roughness having Ra of 6.3 [μm] and Rz of 25 [μm]), and the case of applying porous surface treatment to the surface of the heat transfer wall SF by thermal spraying or the like.

In the case of disposing the pole-like fin in the heat transfer wall SF, and in the case of disposing the dimple in the heat transfer wall SF, particularly, a part on which the refrigerant is sprayed is more narrowly (more finely) set than that in the case of the protruding part BM. Thus, spatial resolution is improved. In the case of increasing the surface roughness of the heat transfer wall SF, and in the case of applying porous surface treatment to the surface of the heat transfer wall SF by thermal spraying or the like, particularly, the surface area of the part on which the refrigerant is sprayed is increased, compared to that in the case of the protruding part BM. Thus, thermal conductance is improved.

According to the configuration of the temperature adjustment system CS according to each of the first example to the fifth example, the plurality of ejection ports JO ejecting the refrigerant to the heat transfer wall SF of the heat exchange unit HE are arranged in a scattered manner across the loading surface FA when seen above the loading surface FA. Thus, the refrigerant may be uniformly ejected to the heat transfer wall SF regardless of place when seen above the loading surface FA. Thus, variation in heat emission for the wafer W loaded on the loading surface FA may be reduced for each place.

The discharge line DLd (including the branch line DLd-1 to the branch line DLd-n) is connected to the liquid puddle area VPL extending below the ejection port JO in the evaporation chamber VP (including the divided chamber VP-1 to the divided chamber VP-n). Thus, the refrigerant that puddles on the bottom wall SFa may be efficiently collected.

In addition, the vaporized refrigerant has a decrease in heat transfer rate and almost does not contribute to heat exchange. Thus, the refrigerant staying in such a state is conversely an obstacle of heat exchange. Accordingly, it is desirable to quickly discharge the vaporized refrigerant. Accordingly, since the discharge line DLu is disposed in the vapor diffusion area VPA extending above the ejection port JO in the evaporation chamber VP (including the divided chamber VP-1 to the divided chamber VP-n), the vapor of the refrigerant present around the heat transfer wall SF may be quickly collected.

In addition, as in the second example, the fourth example, and the fifth example, in a case where each of the evaporation chamber VP and the retention chamber RT is divided into a plurality of divided chambers (the divided chamber VP-1 to the divided chamber VP-n and the divided chamber RT-1 to the divided chamber RT-n) separated from each other, the plurality of divided chambers are arranged in a scattered manner across the loading surface FA when seen above the loading surface FA. Thus, variation in heat emission for the wafer W loaded on the loading surface FA may be reduced for each place.

In addition, as in the second example, the fourth example, and the fifth example, in a case where the retention chamber RT is divided into the plurality of divided chambers RT-1 to RT-n separated from each other, the flow rate of the refrigerant supplied to each divided chamber can be adjusted. Thus, heat emission for the wafer W is finely controlled for each place. Accordingly, variation in heat emission for the wafer W may be further reduced for each place.

In addition, as in the second example, the fourth example, and the fifth example, in a case where each of the evaporation chamber VP and the retention chamber RT is divided into a plurality of divided chambers (the divided chamber VP-1 to the divided chamber VP-n and the divided chamber RT-1 to the divided chamber RT-n) separated from each other, the chiller unit CH-1 to the chiller unit CH-n are individually disposed for the divided chamber RT-1 to the divided chamber RT-n of the retention chamber RT, respectively. The circulation of the refrigerant may be independently performed by each of the chiller unit CH-1 to the chiller unit CH-n. Thus, heat emission for the wafer W may be more finely controlled for each place.

Although various exemplary embodiments have been described above, various modified aspect may be configured without being limited to the above-described exemplary embodiments.

From the foregoing description, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A cleaning method for a component of a plasma processing apparatus, the method comprising:
   a step of removing a reaction product formed on a peripheral side part of an electrostatic chuck of a loading table which is disposed in the plasma processing apparatus and on which a workpiece is loaded, wherein
   the loading table includes a heat exchange unit that is disposed in the plasma processing apparatus and exchanges heat using a refrigerant,
   the step of removing the reaction product includes
      a step of loading a dummy wafer on the loading table,
      a step of increasing a temperature of the loading table by
         having open an expansion valve, disposed between an output terminal of a condenser, which condenses the refrigerant that is discharged from the heat exchange unit and compressed and supplies the refrigerant to the heat exchange unit, and an input terminal of the heat exchange unit,
         inputting heat to the loading table,
         opening a flow dividing valve between an output terminal of a compressor, which compresses the refrigerant discharged from the heat exchange unit and supplies the refrigerant to the condenser, and the input terminal of the heat exchange unit, and
         adjusting an opening degree of the flow dividing valve, and
      a step of introducing a gas mixture to remove the reaction product after increasing the temperature of the loading table, wherein
   in response to a time period elapsing, the heat to the loading table is stopped at the same time that the flow dividing valve is closed, and
   the expansion valve is held open at a constant value throughout the entire step of removing the reaction product while the opening degree of the flow dividing valve is adjusted during the step of removing the reaction product.

2. The cleaning method according to claim 1, wherein the reaction product has carbon, fluorine, and silicon.

3. The cleaning method according to claim 1, wherein the gas mixture contains gas including fluorine and gas including oxygen.

4. The cleaning method according to claim 3, wherein the gas including fluorine includes at least one of $CF_4$, $NF_3$, and $C_4F_8$, and
the gas including oxygen includes at least one of $O_2$, $O_3$, CO, $CO_2$, and COS.

5. The cleaning method according to claim 1, wherein the inputting heat to the loading table is stopped in response to a finish of the step of removing the reaction product after increasing the temperature of the loading table by introducing the gas mixture.

6. The cleaning method according to claim 1, wherein inputting heat to the loading table is performed using plasma.

7. The cleaning method according to claim 1, wherein the loading table includes a heater, and
inputting heat to the loading table is performed by the heater.

* * * * *